United States Patent
Zhang et al.

(10) Patent No.: US 12,325,182 B2
(45) Date of Patent: Jun. 10, 2025

(54) CONDUCTIVE PHOTO-CURABLE COMPOSITIONS FOR ADDITIVE MANUFACTURING

(71) Applicant: Cabot Corporation, Boston, MA (US)

(72) Inventors: Xiaofeng Zhang, Shrewsbury, MA (US); Han Zhang, Burlington, MA (US); Sean S. Sullivan, Lynn, MA (US); Limeng Chen, Arlington, MA (US); Angelica M. Sanchez Garcia, Somerville, MA (US); Agathagelos Kyrlidis, Cambridge, MA (US); Tushar Shah, Fulton, MD (US); Yakov E. Kutsovsky, Arlington, MA (US); Darragh Fitzpatrick, County Kildare (IE); Rachel Hersee, Dublin (IE); Pablo Walter, Cologne (DE)

(73) Assignee: Cabot Corporation, Boston, MA (US)

( * ) Notice: Subject to any disclaimer, the term of this patent is extended or adjusted under 35 U.S.C. 154(b) by 794 days.

(21) Appl. No.: 17/464,022

(22) Filed: Sep. 1, 2021

(65) Prior Publication Data
US 2022/0111582 A1   Apr. 14, 2022

Related U.S. Application Data

(60) Provisional application No. 63/090,766, filed on Oct. 13, 2020.

(51) Int. Cl.
*B29C 64/00* (2017.01)
*B05D 5/12* (2006.01)
(Continued)

(52) U.S. Cl.
CPC .............. *B29C 64/129* (2017.08); *B05D 5/12* (2013.01); *B29C 64/291* (2017.08); *B33Y 10/00* (2014.12);
(Continued)

(58) Field of Classification Search
CPC ... H01B 1/00; H01B 1/24; C09D 5/24; B05D 5/12
See application file for complete search history.

(56) References Cited

U.S. PATENT DOCUMENTS 3,113,708 A   12/1963   Moulic, Jr.
3,535,342 A   10/1970   Emmons
(Continued)

FOREIGN PATENT DOCUMENTS

DE   102007044031 A1   3/2009
EP       0119840 A      9/1984
(Continued)

OTHER PUBLICATIONS

Dos Santos et al "Thermal and mechanical properties of a nanocomposite of a photocurable epoxy-acrylate resin and multiwalled carbon nanotubes", Materials Science and Engineering A 528 (2011) 4318-4324.*

(Continued)

*Primary Examiner* — Mark Kopec

(57) ABSTRACT

A photo-curable composition for use in additive manufacturing, said composition comprising: a) at least one photo-curable monomer or oligomer; b) a photoinitiator for polymerization of the monomer; and, from 0.01 to 1 wt. %, based on the weight of the composition, of c) CNS-derived materials. Following polymerization, the resulting polymerized composition has a volume resistivity no greater than $10^5$ ohm·cm.

17 Claims, 8 Drawing Sheets

(51) Int. Cl.
  *B29C 64/129* (2017.01)
  *B29C 64/291* (2017.01)
  *B33Y 10/00* (2015.01)
  *B33Y 70/10* (2020.01)
  *C08F 2/50* (2006.01)
  *C08F 20/12* (2006.01)
  *C08K 3/04* (2006.01)
  *H01B 1/24* (2006.01)
  *B29K 33/00* (2006.01)

(52) U.S. Cl.
  CPC .............. *B33Y 70/10* (2020.01); *C08F 2/50* (2013.01); *C08F 20/12* (2013.01); *C08K 3/041* (2017.05); *H01B 1/24* (2013.01); *B29K 2033/08* (2013.01); *C08K 2201/011* (2013.01)

(56) References Cited

U.S. PATENT DOCUMENTS

| | | | |
|---|---|---|---|
| 3,671,483 | A | 6/1972 | Young |
| 4,069,055 | A | 1/1978 | Crivello |
| 4,147,685 | A | 4/1979 | Smith, Jr. |
| 4,216,288 | A | 8/1980 | Crivello |
| 4,250,311 | A | 2/1981 | Crivello |
| 4,681,636 | A | 7/1987 | Saito et al. |
| 4,749,741 | A | 6/1988 | Saito et al. |
| 4,835,289 | A | 5/1989 | Brindopke |
| 4,892,954 | A | 1/1990 | Brindopke et al. |
| 5,084,586 | A | 1/1992 | Farooq |
| 5,124,417 | A | 6/1992 | Farooq |
| 5,236,637 | A | 8/1993 | Hull |
| 5,463,084 | A | 10/1995 | Crivello et al. |
| 5,476,748 | A | 12/1995 | Steinmann et al. |
| 5,506,087 | A | 4/1996 | Lapin et al. |
| 5,554,664 | A | 9/1996 | Lamanna et al. |
| 6,121,342 | A | 9/2000 | Suzuki et al. |
| 6,129,244 | A | 10/2000 | Horth |
| 6,231,990 | B1 | 5/2001 | Lin et al. |
| 7,438,846 | B2 | 10/2008 | John |
| 7,892,474 | B2 | 2/2011 | Shkolnik et al. |
| 8,313,006 | B2 | 11/2012 | Willner et al. |
| 8,586,644 | B2 | 11/2013 | Nagareo et al. |
| 8,778,116 | B2 * | 7/2014 | Morimoto .............. B82Y 30/00 977/902 |
| 8,784,937 | B2 | 7/2014 | Malet et al. |
| 9,005,755 | B2 | 4/2015 | Ledford et al. |
| 9,107,292 | B2 | 8/2015 | Shah et al. |
| 9,447,259 | B2 | 9/2016 | Shah et al. |
| 10,588,725 | B2 | 3/2020 | Hagiwara et al. |
| 10,647,857 | B2 * | 5/2020 | Cauchon .............. C09D 135/02 |
| 10,875,975 | B2 | 12/2020 | Reese et al. |
| 11,912,898 | B2 * | 2/2024 | Gui .......................... C09D 5/24 |
| 2001/0004662 | A1 | 6/2001 | Bidell et al. |
| 2009/0124705 | A1 | 5/2009 | Meyer et al. |
| 2013/0292862 | A1 | 11/2013 | Joyce |
| 2013/0295212 | A1 | 11/2013 | Chen et al. |
| 2014/0093728 | A1 | 4/2014 | Shah et al. |
| 2015/0047968 | A1 * | 2/2015 | Elimelech ................ C08K 7/00 522/120 |

FOREIGN PATENT DOCUMENTS

| | | |
|---|---|---|
| EP | 0520426 B1 | 4/1996 |
| EP | 2228414 A1 | 9/2010 |
| GB | 1485925 A | 9/1977 |
| KR | 102041235 B1 | 11/2019 |
| WO | WO 2016/044547 A1 | 3/2016 |
| WO | WO 2016/057250 A1 | 4/2016 |
| WO | WO 2017/040874 A1 | 3/2017 |
| WO | WO 2017/044735 A1 | 3/2017 |

OTHER PUBLICATIONS

Cividanes et al "The Sonication Effect on CNT-Epoxy Composites Finally Clarified", Polymer Composites 2017 (10 pages).*

Moniruzzaman et al "Polymer Nanocomposites Containing Carbon Nanotubes", Macromolecules 2006, 39, 5194-5205.*

The International Search Report and the Written Opinion of the International Searching Auhority, or the Declaration of International Application No. PCT/US2021/048598, mailed Jan. 14, 2022.

* cited by examiner

CONDUCTIVE PHOTO-CURABLE COMPOSITIONS FOR ADDITIVE MANUFACTURING

This application claims priority from U.S. Provisional Application No. 63/090,766, filed Oct. 13, 2020, the entire contents of which are incorporated herein by reference.

FIELD OF THE INVENTION

The present invention concerns materials for the fabrication of solid three-dimensional objects. More particularly, the present invention is concerned with photo-curable compositions which may be used in additive manufacturing processes to join or form solid, three-dimensional (3D) objects.

BACKGROUND OF THE INVENTION

Shaped or moldable synthetic resins are indispensable materials which find important utility in a number of different technical fields. Problematically, the constituent resins are generally characterized by low electrical conductivity: as such, the molded or shaped material may develop an electrostatic charge—through friction for instance—which is only dissipated very slowly. The adverse effects of static charge build-up include: the soiling of polymer surfaces with dirt and dust; electric shocks to persons contacting the resins; the disruption of processes in which the molded resin is employed and which is caused by electrostatic repulsion, attraction and/or charge transfer; destruction of electronic components proximate to or encapsulated by the molded resin; morphological changes in the molded structure; and, sparking, potentially followed by ignition, which may induce explosions in certain circumstances.

It is thus evident that the rapid discharge of electrostatic charge from molded or shaped resins would be desirable for reasons of safety and aesthetics. The existing art has typically addressed the prevention of electrification in one of two manners: i) antistatic monomer or macro-monomer units are included into the resin molecules themselves by co-polymerization; and, ii) antistatic agents are added during the fabrication of a resin under mixing or kneading.

The present inventors have sought a novel solution whereby an anti-static agent is incorporated into a resinous structure formed by additive manufacturing.

In conventional additive manufacturing techniques, the construction of a three-dimensional object is performed in a step-wise or layer-by-layer manner. In many techniques—and as described in inter alia U.S. Pat. No. 5,236,637 (Hull)—a given layer of photo-curable resin is laid down on either the top surface or the bottom surface of a growing object and then solidified under the action of either visible, infrared or UV light irradiation or under an electron beam.

The photo-curable resin used to form the or each layer of the object will contain monomers, oligomers, fillers and additives such as photoinitiators, blockers and colorants depending on the targeted properties of the resin. In order to ensure that the photo-curable resin can be so laid down—in particular, to ensure that the resin is printable—the loading of particular additives must be closely controlled so as not to increase the viscosity of the resin to above a workable value. Heretofore in the art, this concern has stymied the incorporation of effective anti-static agents into photo-curable resins for additive manufacturing.

SUMMARY OF THE INVENTION

In accordance with a first aspect of the present invention there is provided a photo-curable composition for use in additive manufacturing, said composition comprising:
a) at least one photocurable monomer or oligomer;
b) a photoinitiator for polymerization of the monomer or oligomer; and,
from 0.01 to 2 wt. %, based on the weight of the composition, of c) at least one CNS-derived material selected from the group consisting of: carbon nanostructures, fragments of carbon nanostructures, fractured carbon nanotubes, elongated CNS strands, dispersed CNSs, and any combination thereof, wherein,
following polymerization, the resulting polymerized composition has a resistivity, as measured by CTM Method 1, no greater than $10^5$ ohm·cm, for example, no greater than $10^4$ ohm·cm, no greater than $5 \times 10^3$ ohm·cm, no greater than $10^3$ ohm·cm, or no greater than $5 \times 10^2$ ohm·cm.
the carbon nanostructures or fragments of carbon nanostructures include a plurality of multiwall carbon nanotubes that are crosslinked in a polymeric structure by being branched, interdigitated, entangled and/or sharing common walls,
the fractured carbon nanotubes are derived from the carbon nanostructures and are branched and share common walls with one another, and
elongated CNS strands are derived from the carbon nanostructures and include CNTs that have been displaced linearly with respect to one another, and
the dispersed CNS comprise exfoliated fractured CNTs that do not share common walls with one another.

As used herein, CTM Method 1 means applying silver paint to both ends of a rectangular sample bar and drying for 20 min at 23° C., clamping the sample bar between two brass electrodes positioned 43 mm (L) apart, measuring the electrical resistance (ohm) was measured between the painted electrodes according to ASTM D257-07 using a voltmeter-ammeter able to measure volume resistance (Rv) up to about $10^6$-$10^7$ ohm or volume resistivity up to about $10^6$-$10^7$ ohm·cm, and calculating volume resistivity using the following equation:

$$\rho_v = (R_v \times A)/L \text{(ohm·cm)}, \text{ where } A = W \times t \text{(cm}^2\text{)}.$$

Commonly, the composition will comprise, based on the weight of the composition, from 5 to 95 wt. %, preferably from 10 to 90 wt. % of a) said at least one photocurable monomer or oligomer. Said photoinitiator may constitute from 0.1 to 10 wt. %, for example from 0.1 to 5 wt. % of the composition.

Said monomeric component a) may comprise a cationically curable monomer or oligomer, a radically curable monomer or oligomer, or a mixture thereof. In certain advantageous embodiments, said component a) is characterized by comprising:
a1) one or more (meth) acrylate functionalized oligomers; and,
a2) one or more (meth)acrylate monomers, said monomers being preferably selected from the group consisting of monofunctional (meth)acrylate monomers and difunctional (meth)acrylate monomers. That macro-monomer component a1) may comprise or consist of one or more oligomers selected from the group consisting of epoxy (meth)acrylates, urethane (meth)acrylates, polyester (meth)acrylates and polyether (meth) acrylates. Independently or additionally to that preference, the (meth)acrylate monomers a2) should preferably comprise esters of $C_1$-$C_4$ monofunctional alcohols with (meth)acrylic acid.

Alternatively or in addition, the component (b) may be characterized by comprising an organopolysiloxane monomer, oligomer, or mixture thereof.

The photocurable compositions of the present application may be characterized by comprising, based on the weight of the composition, from 0.01 to 1.5 wt. %, for example from 0.01 to 1 wt. %, 0.02 to 0.5 wt. %, or 0.02 to 0.08 wt. % of c) CNS-derived material. The carbon nanostructures may be coated or in a mixture with a binder. The weight of the binder relative to the weight of the coated carbon nanostructures may be within the range of from about 0.1% to about 10%.

The photocurable compositions of the present application may be characterized by further comprising one or more additives selected from fillers, solvents, reactive diluents, corrosion inhibitors, catalysts, antioxidants, UV absorbers/light stabilizers, hydrolysis stabilizers, metal deactivators, antistatic agents, reinforcers, antifogging agents, propellants, biocides, plasticizers, lubricants, emulsifiers, dyes, pigments, rheological agents, impact modifiers, adhesion regulators, optical brighteners, flame retardants, anti-drip agents, nucleating agents, wetting agents, thickeners, protective colloids, defoamers, and tackifiers.

The photocurable compositions of the present application may be characterized by further comprising one or more additives selected from plasticizers, antioxidants, UV stabilizers, hydrolysis stabilizers, toughening rubbers, and fillers.

In certain embodiments, the photocurable compositions of the present application may be characterized by comprising, based on the weight of the composition, from 5 to 20 wt. %, for example, from 5 to 15 wt. %, of a1) one or more (meth) acrylate functionalized oligomers selected from the group consisting of epoxy (meth)acrylates, urethane (meth)acrylates, polyester (meth)acrylates and polyether (meth)acrylates; from 20 to 80 wt. %, for example, from 40 to 80 wt. %, of a2) one or more (meth)acrylate monomers, said monomers being selected from the group consisting of monofunctional (meth)acrylate monomers and difunctional (meth)acrylate monomers; from 0.1 to 10 wt. %, for example, from 0.1 to 5 wt. % of b) photoinitiator; and from 0.01 to 2 wt. %, for example, from 0.1 to 2 wt. % of c) said at least one CNS-derived material.

In accordance with a second aspect of the present invention, there is provided a method for forming a three dimensional object, said method comprising:

i) providing a carrier and an optically transparent member having a movable build surface, said carrier and build surface defining a build region there between;

ii) within said build region, applying by 3D printing a first layer of the composition as defined herein above and in the appended claims;

iii) irradiating said build region through said optically transparent member to at least partially cure that first layer;

iv) applying a subsequent layer of said composition as defined herein above and in the appended claims by 3D printing on the at least partially cured layer; and, v) irradiating said build region through said optically transparent member to at least partially cure that subsequent layer.

In an embodiment thereof, there is provided an iterative method for forming a three dimensional object, wherein said steps iv) and v) as defined above are performed and repeated so as to dispose second, third, fourth and further layers within the build region.

It will be recognized that the recited build surface may be moved away from the carrier to maintain a suitable build region for the application of the defined composition. The build surface and the formed layers of at least partially cured composition provide the scaffold on which subsequent layers may be disposed: the provision of further support means is not precluded, however, and can be applied at an appropriate time to maintain the integrity of an intermediate and/or final three dimensional object. That final object may be separated from all supporting media and further processed, if necessary.

The conductivity of the final object obtained in accordance with the present invention ensures that it dissipates electrostatic charges at an advantageous rate. In addition to this anti-static property, it is submitted that the presence of the carbon nanostructures within the formed object may provide shielding from electromagnetic interference (EMI), which shielding is of critical importance where the cured composition encapsulates or coats an electronic component.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION

Definitions

Figure 1A:
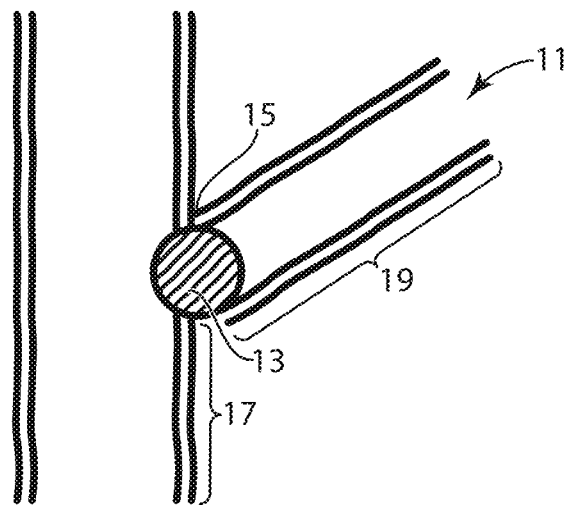
FIGS. 1A and 1B are diagrams illustrating differences between a y-shaped MWCNT, not in or derived from a carbon nanostructure (FIG. 1A), and a branched MWCNT (FIG. 1B) in a carbon nanostructure.

As used herein, the singular forms "a", "an" and "the" include plural referents unless the context clearly dictates otherwise.

The terms "comprising", "comprises" and "comprised of" as used herein are synonymous with "including", "includes", "containing" or "contains", and are inclusive or open-ended and do not exclude additional, non-recited members, elements or method steps.

When amounts, concentrations, dimensions and other parameters are expressed in the form of a range, a preferable range, an upper limit value, a lower limit value or preferable upper and limit values, it should be understood that any ranges obtainable by combining any upper limit or preferable value with any lower limit or preferable value are also specifically disclosed, irrespective of whether the obtained ranges are clearly mentioned in the context.

The words "preferred", "preferably", "desirably" and "particularly", and synonyms thereof, are used frequently herein to refer to embodiments of the disclosure that may afford particular benefits, under certain circumstances. However, the recitation of one or more preferable, preferred, desirable or particular embodiments does not imply that other embodiments are not useful and is not intended to exclude those other embodiments from the scope of the disclosure.

As used throughout this application, the word "may" is used in a permissive sense—that is meaning to have the potential to—rather than in the mandatory sense.

The term "additive manufacturing" as used herein refers to methods of joining or shaping materials by which objects are built from 3D-model data, usually layer-upon-layer; it may be contrasted with subtractive manufacturing technologies. The term "3D-printing" is often used as a synonym for additive manufacturing. Conventionally, a digital model of the object is generated using known modeling methods, including Computer Aided Design (CAD) programs: the digital model is divided into units in which each unit indicates where the material should be located in a layer. The individual units are sent to an additive manufacturing system or 3D printer which deposits the material according to the individual units and generates the complete three-dimensional object layer by layer. The disclosure of ASTM52900-15 or, where appropriate, the updated version of said Standard may here be instructive.

The term "reactive" as used herein, either alone or in the context of a "reactive composition" refers to substances that either can react upon contact or which can be caused to react through one or more of heat, irradiation, pressure, catalysis or contact with air or water.

As used herein, the terms "monomer" and "co-monomer" refer to a molecule that is capable of conversion to polymers, synthetic resins or elastomers by combination with itself or other similar molecules or compounds. The terms are not limited to small molecules but include oligomers, polymers and other large molecules capable of combining with themselves or other similar molecules or compounds.

As used herein, "macro-monomer" refers to a polymer having at least one functional group through which polymerization reactions can proceed. Macro-monomers are thus macromolecular monomers which can be converted to homo- or copolymers of defined structures. It is not precluded that a macro-monomer as used herein comprises more than one polymeric chain attached to one functional group.

As used herein, the term "catalytic amount" means a sub-stoichiometric amount of catalyst relative to a reactant, except where expressly stated otherwise.

The term "curing" herein means to polymerize a mixture including one or more monomers and one or more initiators. "Hardening" may be synonymous with curing and emphasizes that when polymerized, liquid monomer mixtures tend to become solid.

The term "photo-curable composition" as used herein refers to a composition including a component which can be cross-linked, polymerized or cured by electromagnetic wave irradiation.

The term "electromagnetic wave" is a generic term including microwaves, infrared radiation, UV light, visible light, X-rays, y-rays and particles beams including α-particles, proton beams, neutron beams and electron beams.

The term "photoinitiator" as used herein denotes a compound which can be activated by an energy-carrying activation beam—such as electromagnetic radiation—for instance upon irradiation therewith. The term is intended to encompass both photoacid generators and photobase generators. Specifically, the term "photoacid generator" refers to a compound or polymer which generates an acid for the catalysis of the acid hardening resin system upon exposure to electromagnetic radiation. The term "photobase generator" means any material which when exposed to suitable radiation generates one or more bases.

The term "Lewis acid" used herein denotes any molecule or ion—often referred to as an electrophile—capable of combining with another molecule or ion by forming a covalent bond with two electrons from the second molecule or ion: a Lewis acid is thus an electron acceptor.

As used herein, the term "epoxide" denotes a compound characterized by the presence of at least one cyclic ether group, namely one wherein an ether oxygen atom is attached to two adjacent carbon atoms thereby forming a cyclic structure. The term is intended to encompass monoepoxide compounds, polyepoxide compounds (having two or more epoxide groups) and epoxide terminated prepolymers. The term "monoepoxide compound" is meant to denote epoxide compounds having one epoxy group. The term "polyepoxide compound" is meant to denote epoxide compounds having at least two epoxy groups. The term "diepoxide compound" is meant to denote epoxide compounds having two epoxy groups.

The epoxide may be unsubstituted but may also be inertly substituted. Exemplary inert substituents include chlorine, bromine, fluorine and phenyl.

As used herein, "$C_1$-$C_n$ alkyl" group refers to a monovalent group that contains 1 to n carbons atoms, that is a radical of an alkane and includes straight-chain and branched organic groups. As such, a "$C_1$-$C_{30}$ alkyl" group refers to a monovalent group that contains from 1 to 30 carbons atoms, that is a radical of an alkane and includes straight-chain and branched organic groups. Examples of alkyl groups include, but are not limited to: methyl; ethyl; propyl; isopropyl; n-butyl; isobutyl; sec-butyl; tert-butyl; n-pentyl; n-hexyl; n-heptyl; and, 2-ethylhexyl. In the present invention, such alkyl groups may be unsubstituted or may be substituted with one or more substituents such as halo, nitro, cyano, amido, amino, sulfonyl, sulfinyl, sulfanyl, sulfoxy, urea, thiourea, sulfamoyl, sulfamide and hydroxy. The halogenated derivatives of the exemplary hydrocarbon radicals listed above might, in particular, be mentioned as examples of suitable substituted alkyl groups. In general, however, a preference for unsubstituted alkyl groups containing from 1-18 carbon atoms ($C_1$-$C_{18}$ alkyl)—for example unsubstituted alkyl groups containing from 1 to 12 carbon atoms ($C_1$-$C_{12}$ alkyl)—should be noted.

The term "$C_3$-$C_{30}$ cycloalkyl" is understood to mean a saturated, mono-, bi- or tricyclic hydrocarbon group having from 3 to 30 carbon atoms. In general, a preference for cycloalkyl groups containing from 3-18 carbon atoms ($C_3$-$C_{18}$ cycloalkyl groups) should be noted. Examples of cycloalkyl groups include: cyclopropyl; cyclobutyl; cyclopentyl; cyclohexyl; cycloheptyl; cyclooctyl; adamantane; and, norbornane.

As used herein, an "$C_6$-$C_{18}$ aryl" group used alone or as part of a larger moiety—as in "aralkyl group"—refers to optionally substituted, monocyclic, bicyclic and tricyclic ring systems in which the monocyclic ring system is aromatic or at least one of the rings in a bicyclic or tricyclic ring system is aromatic. The bicyclic and tricyclic ring systems include benzofused 2-3 membered carbocyclic rings. Exemplary aryl groups include: phenyl; indenyl; naphthalenyl, tetrahydronaphthyl, tetrahydroindenyl; tetrahydroanthracenyl; and, anthracenyl. And a preference for phenyl groups may be noted.

As used herein, "$C_2$-$C_2$ alkenyl" refers to hydrocarbyl groups having from 2 to 12 carbon atoms and at least one unit of ethylenic unsaturation. The alkenyl group can be straight chained, branched or cyclic and may optionally be substituted. The term "alkenyl" also encompasses radicals having "cis" and "trans" configurations, or alternatively, "E" and "Z" configurations, as appreciated by those of ordinary skill in the art. In general, however, a preference for unsubstituted alkenyl groups containing from 2 to 10 ($C_{2-10}$) or 2 to 8 ($C_{2-8}$) carbon atoms should be noted. Examples of said $C_2$-$C_{12}$ alkenyl groups include, but are not limited to: —CH=CH$_2$; —CH=CHCH$_3$; —CH$_2$CH=CH$_2$; —C(=CH$_2$)(CH$_3$); —CH=CHCH$_2$CH$_3$; —CH$_2$CH=CHCH$_3$; —CH$_2$CH$_2$CH=CH$_2$; —CH=C(CH$_3$)$_2$; —CH$_2$C(=CH$_2$)(CH$_3$); —C(=CH$_2$)CH$_2$CH$_3$; —C(CH$_3$)=CHCH$_3$; —C(CH$_3$)CH=CH$_2$; —CH=CHCH$_2$CH$_3$; —CH$_2$CH=CHCH$_2$CH$_3$; —CH$_2$CH$_2$CH=CHCH$_3$; —CH$_2$CH$_2$CH$_2$CH=CH$_2$; —C(=CH$_2$)CH$_2$CH$_2$CH$_3$; —C(CH$_3$)=CHCH$_2$CH$_3$; —CH(CH$_3$)CH=CHCH; —CH(CH$_3$)CH$_2$CH=CH$_2$; —CH$_2$CH=C(CH$_3$)$_2$; 1-cyclopent-1-enyl; 1-cyclopent-2-enyl; 1-cyclopent-3-enyl; 1-cyclohex-1-enyl; 1-cyclohex-2-enyl; and, 1-cyclohexyl-3-enyl.

As used herein, "alkylaryl" refers to alkyl-substituted aryl groups and "substituted alkylaryl" refers to alkylaryl groups further bearing one or more substituents as set forth above.

The term "hetero" as used herein refers to groups or moieties containing one or more heteroatoms, such as N, O, Si and S. Thus, for example "heterocyclic" refers to cyclic groups having, for example, N, O, Si or S as part of the ring structure. "Heteroalkyl" and "heterocycloalkyl" moieties are alkyl and cycloalkyl groups as defined hereinabove, respectively, containing N, O, Si or S as part of their structure.

As used herein "polyisocyanate" means a compound comprising at least two —N=C=O functional groups, for example from 2 to 5 or from 2 to 4 —N=C=O functional groups. Suitable polyisocyanates—for use in deriving the urethane (meth)acrylate compounds described herein below—include aliphatic, cycloaliphatic, aromatic and heterocyclic isocyanates, dimers and trimers thereof, and mixtures thereof.

Aliphatic and cycloaliphatic polyisocyanates can comprise from 6 to 100 carbon atoms linked in a straight chain or cyclized and have at least two isocyanate reactive groups. Examples of suitable aliphatic isocyanates include but are not limited to straight chain isocyanates such as ethylene diisocyanate, trimethylene diisocyanate, tetramethylene diisocyanate, 1,6-hexamethylene diisocyanate (HDI), octamethylene diisocyanate, nonamethylene diisocyanate, decamethylene diisocyanate, 1,6,11-undecanetriisocyanate, 1,3,6-hexamethylene triisocyanate, bis(isocyanatoethyl)-carbonate, and bis (isocyanatoethyl) ether. Exemplary cycloaliphatic polyisocyanates include, but are not limited to, dicyclohexylmethane 4,4'-diisocyanate ($H_{12}$MDI), 1-isocyanatomethyl-3-isocyanato-1,5,5-trimethyl-cyclohexane (isophorone diisocyanate, IPDI), cyclohexane 1,4-diisocyanate, hydrogenated xylylene diisocyanate ($H_6$XDI), 1-methyl-2,4-diisocyanato-cyclohexane, m- or p-tetramethylxylene diisocyanate (m-TMXDI, p-TMXDI) and dimer fatty acid diisocyanate.

The term "aromatic polyisocyanate" is used herein to describe organic isocyanates in which the isocyanate groups are directly attached to the ring(s) of a mono- or polynuclear aromatic hydrocarbon group. In turn the mono- or polynuclear aromatic hydrocarbon group means an essentially planar cyclic hydrocarbon moiety of conjugated double bonds, which may be a single ring or may include multiple condensed (fused) or covalently linked rings. The term aromatic also includes alkylaryl. Typically, the hydrocarbon (main) chain includes 5, 6, 7 or 8 main chain atoms in one cycle. Examples of such planar cyclic hydrocarbon moieties include, but are not limited to, cyclopentadienyl, phenyl, napthalenyl-, [10]annulenyl-(1,3,5,7,9-cyclodecapentaenyl-), [12]annulenyl-, [8]annulenyl-, phenalene (perinaphthene), 1,9-dihydropyrene, chrysene (1,2-benzophenanthrene). Examples of alkylaryl moieties are benzyl, phenethyl, 1-phenylpropyl, 2-phenylpropyl, 3-phenylpropyl, 1-naphthylpropyl, 2-naphthylpropyl, 3-naphthylpropyl and 3-naphthylbutyl.

Exemplary aromatic polyisocyanates include, but are not limited to: all isomers of toluene diisocyanate (TDI), either in the isomerically pure form or as a mixture of several isomers; naphthalene 1,5-diisocyanate; diphenylmethane 4,4'-diisocyanate (MDI); diphenylmethane 2,4'-diisocyanate and mixtures of diphenylmethane 4,4'-diisocyanate with the 2,4' isomer or mixtures thereof with oligomers of higher functionality (so-called crude MDI); xylylene diisocyanate (XDI); diphenyl-dimethylmethane 4,4'-diisocyanate; di- and tetraalkyl-diphenylmethane diisocyanates; dibenzyl 4,4'-diisocyanate; phenylene 1,3-diisocyanate; and, phenylene 1,4-diisocyanate.

It is noted that the term "polyisocyanate" is intended to encompass pre-polymers formed by the partial reaction of the aforementioned aliphatic, cycloaliphatic, aromatic and heterocyclic isocyanates with polyols to give isocyanate functional oligomers, which oligomers may be used alone or in combination with free isocyanate(s).

"Two-component (2K) compositions" in the context of the present invention are understood to be compositions in which an epoxide-group containing component and the hardener (curative) component must be stored in separate vessels because of their (high) reactivity. The two components are mixed only shortly before application and then react, typically without additional activation, with bond formation and thereby formation of a polymeric network. However, catalysts may also be employed or higher temperatures applied in order to accelerate the cross-linking reaction.

As used herein the qualification "rigid" defines a component that is self-supporting, inflexible and non-compressible.

Having regard to the "supporting media" mentioned above, that media should be rigid and thus should be self-supporting and provide mechanical support to the coating layer disposed thereon. Without intention to the limit the present invention, that rigid supporting media should preferably be characterized by at least one of: a tensile modulus of at least 2000 MPa, as measured in accordance with ASTM D 638 at a temperature of 23° C.±2° C.; and, a Flexural Modulus of at least 2000 MPa, as measured in accordance with ASTM D 790 at a temperature of 23° C.±2° C.

The Shore A hardness of a given material mentioned herein is determined using a durometer in accordance with ISO 868 entitled "*Plastics and Ebonite—Determination of Indentation Hardness by Means of a Durometer (Shore Hardness)*", the contents of which standard are incorporated herein by reference in their entirety. Throughout the present description, all standard Shore A hardness measurements were performed on injection molded plates at 10 seconds using Type A durometer.

As used herein, "surface resistivity" denotes the resistance to leakage current along the surface of an insulating material. Further, the term "volume resistivity" denotes is the resistance to leakage current through the body of an insulating material. The higher the surface/volume resistivity, the lower the leakage current and the less conductive the material is. Measurements for surface and volume resistivity are obtained in accordance with ASTM D257, IEC 62631-3-1.

The molecular weights referred to in this specification can be measured with gel permeation chromatography (GPC) using polystyrene calibration standards, such as is done according to ASTM 3536.

As used herein, "nano-" is a prefix for the size of a structure or element thereof having a width or a diameter of less than 1 μm and preferably less than 500 nm. Unless otherwise stated, nanoscale dimensions are determined by Scanning Electron Microscopy (SEM) measurements.

As used herein, "ambient conditions" means the temperature and pressure of the surroundings in which the coating layer or the substrate of said coating layer is located.

As used herein, "anhydrous" means the relevant composition includes less than 0.25% by weight of water. For example the composition may contain less than 0.1% by weight of water or be completely free of water. The term "essentially free of solvent" should be interpreted analogously as meaning the relevant composition comprises less than 0.25% by weight of solvent.

Components
Part a): Polymerizable Compounds

The composition of the present invention should comprise, based on the weight of the composition, from 5 to 95 wt. %, preferably from 10 to 90 wt. % of a) at least one photocurable monomer. It is preferred that said component a) comprises one or cationically curable monomers, one or more radically curable monomers or a mixture of both cationically curable monomer(s) and radically curable monomer(s).

The curing of the monomeric component should yield a polymeric matrix having a softening point in the range from 50 to 250° C., preferably from 130° C. to 200° C. Independently of or additionally to that softening condition, the monomer composition of component a) may be selected such that the cured polymeric matrix, applied as a layer, has a Shore A hardness of not higher than 90, for example from 0 to 90, preferably from 40 or 50 to 90.

i) Cationically Curable Monomer

There is no particular intention to limit the cationically curable monomers which may find utility in the present compositions. The polymerizable moiety of the monomers may, for example, be provided by epoxide, vinyl ether or oxetane groups. From literature, illustrative examples of cationically curable monomers are disclosed in inter alia: US2001/0046642; U.S. Pat. Nos. 5,476,748; 5,506,087; 5,463,084; and, U.S. Pat. No. 6,121,342. Equally, commercial examples of curable monomers include but are not limited to: Vectomer® 4010, 4020, 4051, 4060 and 5015 available from Morflex; Pluriol-E200 divinyl ether (PEG200-DVE), poly-THF290 divinylether (PTHF290-DVE) and polyethyleneglycol-520 methyl vinylether (MPEG500-VE), available from BASF Corporation; Uvacure® Nos. 1500-1502, 1530-1534 and 1561-1562, available from UCB Radcure Corporation; UNR-6100, UVR-6105, UNR-6110, UNR-6128, UNR-6200, UVR-6216 available from DOW Corporation; Araldite GY series that is Bisphenol A epoxy liquid resins; Araldite CT and GT series (Bisphenol A epoxy solid resins); Araldite PY series (Bisphenol F epoxy liquids); Araldite CY 177, CY 179 and PY 284 (cycloaliphatic epoxies); Araldite DY and RD reactive diluent series; Araldite ECN series (epoxy cresol novolacs); Araldite EPN series (epoxy phenol novolacs), wherein Araldite is sourced from Ciba Specialty Chemicals Corporation; Heloxy® 44, 48, 84 and 107 available from Resolution Performance Products; Celoxide® 2021, 202 IP, 2081, 2083, 2085, 2000, 3000; Epolead® GT-300, GT-302, GT-400, 401 and 403 available from Daicel Chemical Industries Co., Ltd; and, KRM-2100, KRM-2110, KRM-2199, KRM-2400, KRM-2410, KRM-2408, KRM-2490, KRM-2200, KRM-2720, KRM-2750 available from Asahi Denka Kogyo Co., Ltd.

In important embodiments, the cationically curable monomer may include one or more epoxide compounds. Epoxy resins as used herein may include mono-functional epoxy resins, multi- or poly-functional epoxy resins, and combinations thereof. The epoxy resins may be pure compounds but equally may be mixtures of epoxy functional compounds, including mixtures of compounds having different numbers of epoxy groups per molecule. An epoxy resin may be saturated or unsaturated, aliphatic, cycloaliphatic, aromatic or heterocyclic and may be substituted. Further, the epoxy resin may also be monomeric or polymeric.

Without intention to limit the polymerization processes of present invention, illustrative monoepoxide monomers include: alkylene oxides; epoxy-substituted cycloaliphatic hydrocarbons, such as cyclohexene oxide, vinylcyclohexene monoxide, (+)-cis-limonene oxide, (+)-cis,trans-limonene oxide, (−)-cis,trans-limonene oxide, cyclooctene oxide, cyclododecene oxide and α-pinene oxide; epoxy-substituted aromatic hydrocarbons; monoepoxy substituted alkyl ethers of monohydric alcohols or phenols, such as the glycidyl ethers of aliphatic, cycloaliphatic and aromatic alcohols; monoepoxy-substituted alkyl esters of monocarboxylic acids, such as glycidyl esters of aliphatic, cycloaliphatic and aromatic monocarboxylic acids; monoepoxy-substituted alkyl esters of polycarboxylic acids wherein the other carboxy group(s) are esterified with alkanols; alkyl and alkenyl esters of epoxy-substituted monocarboxylic acids; epoxyalkyl ethers of polyhydric alcohols wherein the other OH group(s) are esterified or etherified with carboxylic acids or alcohols; and, monoesters of polyhydric alcohols and epoxy monocarboxylic acids, wherein the other OH group(s) are esterified or etherified with carboxylic acids or alcohols.

By way of example, the following glycidyl ethers might be mentioned as being particularly suitable monoepoxide monomers for use herein: methyl glycidyl ether; ethyl glycidyl ether; propyl glycidyl ether; butyl glycidyl ether; pentyl glycidyl ether; hexyl glycidyl ether; cyclohexyl glycidyl ether; octyl glycidyl ether; 2-ethylhexyl glycidyl ether; allyl glycidyl ether; benzyl glycidyl ether; phenyl glycidyl ether; 4-tert-butylphenyl glycidyl ether; 1-naphthyl glycidyl ether; 2-naphthyl glycidyl ether; 2-chlorophenyl glycidyl ether; 4-chlorophenyl glycidyl ether; 4-bromophenyl glycidyl ether; 2,4,6-trichlorophenyl glycidyl ether; 2,4,6-tribromophenyl glycidyl ether; pentafluorophenyl glycidyl ether; o-cresyl glycidyl ether; m-cresyl glycidyl ether; and, p-cresyl glycidyl ether.

In an important embodiment, the monoepoxide monomer conforms to Formula (I) herein below:

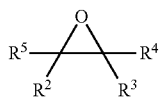

wherein: $R^2$, $R^3$, $R^4$ and $R^5$ may be the same or different and are independently selected from hydrogen, a halogen atom, a $C_1$-$C_8$ alkyl group, a $C_3$ to $C_{10}$ cycloalkyl group, a $C_2$-$C_{12}$ alkenyl, a $C_6$-$C_{18}$ aryl group or a $C_7$-$C_{18}$ aralkyl group, with the proviso that at least one of $R^3$ and $R^4$ is not hydrogen.

In specific embodiments, $R^2$, $R^3$ and $R^5$ are hydrogen and $R^4$ is either a phenyl group or a $C_1$-$C_8$ alkyl group, for example, a $C_1$-$C_4$ alkyl group.

Having regard to this embodiment, exemplary monoepoxides include: ethylene oxide; 1,2-propylene oxide (propylene oxide); 1,2-butylene oxide; cis-2,3-epoxybutane; trans-2,3-epoxybutane; 1,2-epoxypentane; 1,2-epoxyhexane; 1,2-heptylene oxide; decene oxide; butadiene oxide; isoprene oxide; and, styrene oxide.

In specific embodiments, at least one monoepoxide monomer may be selected from the group consisting of: ethylene oxide; propylene oxide; cyclohexene oxide; (+)-cis-limonene oxide; (+)-cis,trans-limonene oxide; (-)-cis,trans-limonene oxide; cyclooctene oxide; and, cyclododecene oxide. For example, propylene oxide may be either one of the epoxide monomers subjected to polymerization or the sole epoxide monomer.

Again, without intention to limit the polymerization processes of present invention, suitable polyepoxide monomers may be liquid, solid or in solution in solvent. Further, such polyepoxide compounds should have an epoxy equivalent weight of from 100 to 700 g/eq, for example from 120 to 320 g/eq. And generally, diepoxide compounds having epoxy equivalent weights of less than 500 or even less than 400 are preferred: this is predominantly from a costs standpoint, as in their production, lower molecular weight epoxy resins require more limited processing in purification.

As examples of types or groups of polyepoxide compounds which may be polymerized in the present invention, mention may be made of: glycidyl ethers of polyhydric alcohols and polyhydric phenols; glycidyl esters of polycarboxylic acids; and, epoxidized polyethylenically unsaturated hydrocarbons, esters, ethers and amides.

Suitable diglycidyl ether compounds may be aromatic, aliphatic or cycloaliphatic in nature and, as such, can be derivable from dihydric phenols and dihydric alcohols. And useful classes of such diglycidyl ethers are: diglycidyl ethers of aliphatic and cycloaliphatic diols, such as 1,2-ethanediol, 1,4-butanediol, 1,6-hexanediol, 1,8-octanediol, 1,12-dodecanediol, cyclopentane diol and cyclohexane diol; bisphenol A based diglycidylethers; bisphenol F diglycidyl ethers; diglycidyl o-phthalate, diglycidyl isophthalate and diglycidyl terephthalate; polyalkyleneglycol based diglycidyl ethers, in particular polypropyleneglycol diglycidyl ethers; and, polycarbonatediol based glycidyl ethers. Other suitable diepoxides which might also be mentioned include: diepoxides of double unsaturated fatty acid $C_1$-$C_{18}$ alkyl esters; butadiene diepoxide; polybutadiene diglycidyl ether; vinylcyclohexene diepoxide; and, limonene diepoxide.

Further illustrative polyepoxide compounds include but are not limited to: glycerol polyglycidyl ether; trimethylolpropane polyglycidyl ether; pentaerythritol polyglycidyl ether; diglycerol polyglycidyl ether; polyglycerol polyglycidyl ether; and, sorbitol polyglycidyl ether.

Specific polyepoxide compounds include: bisphenol-A epoxy resins, such as DER™ 331, and DER™ 383; bisphenol-F epoxy resins, such as DER™ 354; bisphenol-A/F epoxy resin blends, such as DER™ 353; aliphatic glycidyl ethers, such as DER™ 736; polypropylene glycol diglycidyl ethers, such as DER™ 732; solid bisphenol-A epoxy resins, such as DER™ 661 and DER™ 664 UE; solutions of bisphenol-A solid epoxy resins, such as DER™ 671-X75; epoxy novolac resins, such as DEN™ 438; brominated epoxy resins such as DER™ 542; castor oil triglycidyl ether, such as ERISYS™ GE-35H; polyglycerol-3-polyglycidyl ether, such as ERISYS™ GE-38; and, sorbitol glycidyl ether, such as ERISYS™ GE-60.

Where the component a) comprises one or more epoxide compounds, the present invention does not preclude the photocurable compositions further comprising one or more cyclic monomers selected from the group consisting of: oxetanes; cyclic carbonates; cyclic anhydrides; and, lactones. The disclosures of the following citations may be instructive in disclosing suitable cyclic carbonate functional compounds: U.S. Pat. Nos. 3,535,342; 4,835,289; 4,892,954; UK Patent No. GB-A-1,485,925; and, EP-A-0 119 840. However, such cyclic co-monomers should constitute less than 20 wt. %, preferably less than 10 wt. % or less than 5 wt. %, based on the total weight of photocurable monomers.

As noted above, the cationically curable monomer of component a) may include compounds containing vinyl ether groups. The vinyl ether monomers may include substituted, protected-substituted and unsubstituted $C_3$-$C_{30}$ cycloalkyl vinyl ethers, substituted, protected-substituted and unsubstituted $C_1$-$C_{20}$ alkyl vinyl ethers. Vinylethers having aromatic moieties in their molecules are not precluded and mention may also be made of aliphatic polyalkoxy di(poly)vinylethers; polyalkylene di(poly)vinylethers; and, hydroxy-functionalized mono(poly)vinylethers.

Particular examples of vinyl ethers include: ethyl vinylether; n-propyl vinylether; isopropyl vinylether; n-butyl vinylether; isobutyl vinylether; octadecyl vinylether; cyclohexyl vinylether; butanediol divinylether; cyclohexanedimethanol divinylether; diethyleneglycol divinylether; triethyleneglycol divinylether; tert-butyl vinylether; tert-amyl vinylether; ethylhexyl vinylether; dodecyl vinylether; ethyleneglycol divinylether; ethyleneglycolbutyl vinylether; hexanediol divinylether; triethyleneglycol methylvinylether; tetraethyleneglycol divinylether; trimethylolpropane trivinylether; aminopropyl vinylether; diethylaminoethyl vinylether; ethylene glycol divinyl ether; polyalkylene glycol divinyl ether; alkyl vinyl ether; and, 3,4-dihydropyran-2-methyl 3,4-dihydropyran-2-carboxylate.

Examples of hydroxy-functionalized mono(poly)vinylethers include polyalkyleneglycol monovinylethers, polyalkylene alcohol-terminated polyvinylethers, butanediol monovinylether, cyclohexanedimethanol monovinylether, ethyleneglycol monovinylether, hexanediol monovinylether, and diethyleneglycol monovinylether.

ii) Radically Curable Monomers

Radically curable monomers are conventionally characterized by containing ethylenically unsaturated groups: where component a) is to be radically curable under photoinitation, that component a) might therefore conventionally comprise at least one olefinically unsaturated monomer selected from the group consisting of: (meth)acrylonitrile; alkyl (meth)acrylate esters; (meth)acrylic acids; vinyl esters; and, vinyl monomers.

Without intention to limit the present invention, suitable vinyl monomers include: 1,3-butadiene; isoprene; styrene; divinyl benzene; heterocyclic vinyl compounds; and, vinyl halides such as chloroprene. Preferably the vinyl monomers include ethylene, styrene, butadiene and isoprene. Suitable vinyl esters include vinyl acetate, vinyl propionate, vinyl versatate and vinyl laurate. Suitable alkyl esters of acrylic acid and methacrylic acid are those derived from $C_1$ to $C_{14}$ alcohols and thereby include as non-limiting examples: methyl acrylate; methyl methacrylate; ethyl acrylate; ethyl methacrylate; n-butyl acrylate; n-butyl methacrylate; 2-ethylhexyl acrylate; 2-ethylhexyl methacrylate; isopropyl acrylate; hydroxyethyl methacrylate; hydroxypropyl methacrylate; isopropyl methacrylate; n-propyl acrylate; n-propyl methacrylate; and, di(meth)acrylate esters of alkane diols such as 1,6-hexane diol diacrylate. Additional radically curable monomers include those disclosed in U.S. Ser. No. 10/588,725, the entire contents of which are incorporated herein by reference.

In one embodiment of a component a) which is radically curable under photoinitiation, component a) is characterized by comprising: i) an organopolysiloxane compound having an average of at least two silicon-bonded ethylenically unsaturated groups per molecule; and, ii) an organosilicon compound having an average of at least two silicon-bonded hydrogen atoms per molecule in an amount sufficient to cure the photocurable silicone composition. Such a component a) would be cured using catalytic amount of a photoactivated hydrosilylation catalyst. Typically, the silicon-bonded ethylenically unsaturated groups are alkenyl groups, such as vinyl, allyl, butenyl, hexenyl, and octenyl groups. Moreover, the silicon-bonded ethylenically unsaturated groups and the silicon-bonded hydrogen atoms of the organopolysiloxane (i) and the organosilicon compound (ii), respectively, may independently be pendent, terminal or in both positions.

The organopolysiloxane (i) and the organosilicon compound (ii) of said photocurable silicone composition may independently be linear, branched, cyclic or resinous. In particular, the organopolysiloxane (i) and the organosilicon compound (ii) may comprise any combination of M, D, T, and Q units as defined hereinabove.

In certain embodiments of the present invention, there is provided a photocurable silicone composition in which one of the organopolysiloxane (i) and the organosilicon compound (ii) comprises a silicone resin, which typically comprises T and/or Q units in combination with M and/or D units. When the organopolysiloxane (i) and/or organosilicon compound (ii) comprises a silicone resin, the silicone resin may be a DT resin, an MT resin, an MDT resin, a DTQ resin, an MTQ resin, an MDTQ resin, a DQ resin, an MQ resin, a DTQ resin, an MTQ resin or an MDQ resin. Generally, when the hydrosilylation-curable silicone composition comprises a resin, the layer(s) and resulting 3D article have increased rigidity.

In alternative embodiments, the organopolysiloxane (i) and/or the organosilicon compound (ii) is an organopolysiloxane comprising repeating D units. Such organopolysiloxanes may include some branching attributable to T and/or Q units but are desirably substantially or wholly linear. In such embodiments, the layer(s) and resulting 3D article are elastomeric.

Exemplary, but non-limiting, silicone compositions are disclosed in: WO2017040874A1 (Dow Corning Corporation); WO2017044735A1 (Dow Corning Corporation); and, WO2016044547A1 (Dow Corning Corporation).

In a second important embodiment of a component a) which is radically curable under photoinitation, component a) is characterized by comprising:
   a1) one or more (meth) acrylate functionalized oligomers; and,
   a2) one or more (meth)acrylate monomers, said monomers being preferably selected from
   the group consisting of monofunctional (meth)acrylate monomers and difunctional (meth)acrylate monomers.

In specific embodiments, the macro-monomer component a1) comprises or consists of one or more oligomers selected from the group consisting of epoxy (meth)acrylates, urethane (meth)acrylates, polyester (meth)acrylates and polyether (meth)acrylates.

Suitable epoxy (meth)acrylate resins are obtained by adding (meth)acrylic acid to an epoxy resin or an alicyclic epoxy resin. The epoxy resin which is subjected to modification can be prepared, for example, by reacting bisphenol A, bisphenol F, bisphenol S, or phenol novolak with epichlorohydrin. The alicyclic epoxy resin which is subjected to modification can be prepared, for example, by reacting cyclopentadiene oxide or cyclohexene oxide with epichlorohydrin.

As is known in the art, urethane (meth) acrylate oligomers may be prepared by reaction of a polyfunctional (meth) acrylate bearing a hydroxyl group with a polyisocyanate as defined herein above. In particular, the polyfunctional (meth)acrylate bearing a hydroxyl group may be selected from the group consisting of: 2-hydroxyethyl (meth)acrylate; 2-hydroxyisopropyl (meth)acrylate; 4-hydroxybutyl (meth)acrylate; hydroxyethylcaprolactone (meth)acrylate; pentaerythritol tri(meth)acrylate; pentaerythritol tetra(meth)acrylate; dipentaerythritol penta(meth)acrylate; dipentaerythritol hexa(meth)acrylate; and, combinations thereof.

Suitable polyester (meth)acrylate oligomers are obtained by reacting (meth)acrylic acid with a polyester prepared from a polybasic acid or an anhydride thereof and a polyhydric alcohol. Examples of the polybasic acid include, but are not limited to: phthalic acid; succinic acid; adipic acid; glutaric acid; sebacic acid; isosebacic acid; tetrahydrophthalic acid; hexahydrophthalic acid; dimer acid; trimellitic acid; pyromellitic acid; pimelic acid; and, azelaic acid. Examples of the polyhydric alcohol include but are not limited to: 1,6-hexanediol; diethylene glycol; 1,2-propylene glycol; 1,3-butylene glycol; neopentyl glycol; dipropylene glycol; polyethylene glycol; and, polypropylene glycol.

As is known in the art, polyether (meth)acrylate oligomers may be obtained by an ester exchange reaction between a polyether and a (meth)acrylate ester, such as ethyl methacrylate. Exemplary polyethers include polyethers obtained from ethoxylated or propoxylated trimethylolpropane, pentaerythritol or the like, or by polyetherification of 1,4-propanediol or the like.

The (meth)acrylate monomers a2) may be any ester of acrylic acid or methacrylic acid known to the art. In particular, the monomers may be selected from: esters of $C_1$-$C_6$ monofunctional alcohols with (meth)acrylic acid, including but not limited to methyl acrylate, methyl methacrylate, ethyl acrylate, ethyl methacrylate, n-propyl acrylate, n-propyl methacrylate, isopropyl acrylate, isopropyl methacrylate, butyl acrylate (all isomers), butyl methacrylate (all isomers), hexyl acrylate and hexyl methacrylate; esters of higher molecular weight alcohols having up to 12 carbon atoms, such as lauryl (meth)acrylate, 2-ethylhexyl (meth)acrylate and isodecyl (meth)acrylate; esters of cycloaliphatic alcohols, such as cyclohexyl (meth)acrylate); hydroxy-functional (meth)acrylate esters of di/poly-functional alcohols such as hydroxyethyl (meth)acrylate, hydroxypropyl (meth)acrylate or pentaerythritol tri(meth)acrylate; di/poly-esters of di/poly-functional alcohols, such as ethylene glycol di(meth)acrylate, 1,3 or 1,4-butanediol di(meth)acrylate, 1,6-hexanediol di(meth)acrylate and trimethylolpropane tri (meth)acrylate; epoxy functional (meth)acrylate monomers, such as glycidyl acrylate, glycidyl methacrylate, 3,4-epoxycyclohexylmethyl acrylate and 3,4-epoxycyclohexylmethyl methacrylate; and, (meth)acrylate esters formed by alcohols bearing other functional groups, such as tetrahydrofurfuryl (meth)acrylate or benzyl (meth)acrylate.

In specific embodiments, the (meth)acrylate monomers a2) comprise at least one ester of a $C_1$-$C_4$ monofunctional alcohol with (meth)acrylic acid: a particular preference for methacrylate esters may be noted here.

Exemplary but non-limiting poly (meth)acylate binders are disclosed in U.S. Pat. No. 8,586,644 (Nagareo et al.). Loctite 3840 may be mentioned as a suitable commercial example.

Part b): Photoinitiator

The present composition also includes a photoinitiator which, under irradiation, absorbs photons and forms reactive species out of the excited state, which species initiate consecutive reactions. Dependent upon the polymerizable compounds present, the initiating species may be radicals, cations or anions. Irrespective of whether a radical photoinitiator, a photobase generator or a photoacid generator is employed, the selected photoinitiator should exhibit at least the following properties: (i) high absorption at the exposure wavelength and a high molar extinction coefficient; (ii) a high quantum yield of formation of initiating species; and, (iii) a high reactivity of the initiating species towards the monomer.

Upon irradiation with light energy, ionic photoacid generators (PAGs) undergo a fragmentation reaction and release one or more molecules of Lewis or Bronsted acid that catalyze the consecutive reactions, for instance the ring opening and addition of pendent epoxide groups to form a crosslink.

Useful photoacid generators are thermally stable, do not undergo thermally induced reactions with the forming (co-) polymer and are readily dissolved or dispersed in the curable compositions. Photoacid generators are known in the art and instructive reference may be made to: K. Dietliker, *Chemistry and Technology of UV and EB Formulation for Coatings, Inks and Paints*, Vol. III, SITA Technology Ltd., London (1991); and, Kirk-Othmer *Encyclopedia of Chemical Technology*, 4. Sup.Th Edition, Supplement Volume, John Wiley and Sons, New York, pp 253-255.

Exemplary cations which may be used as the cationic portion of the ionic PAG include organic onium cations such as those described in U.S. Pat. Nos. 4,250,311, 3,113,708, 4,069,055, 4,216,288, 5,084,586, 5,124,417, and, U.S. Pat. No. 5,554,664. The references specifically encompass aliphatic or aromatic Group IVA and VIIA (CAS version) centered onium salts, with a preference being noted for I-, S-, P-, Se- N- and C-centered onium salts, such as those selected from sulfoxonium, iodonium, sulfonium, selenonium, pyridinium, carbonium and phosphonium.

As is known in the art, the nature of the counter-anion in the ionic photoacid generator (PAG) can influence the rate and extent of cationic addition polymerization. For illustration, Crivello et al. Chem. Mater., 4, 692, (1992) reports that the order of reactivity among commonly used nucleophilic anions is $SbF_6^->AsF_6^->PF_6^->BF_4^-$. The influence of the anion on reactivity has been ascribed to three principle factors which the skilled artisan should compensate for in the present invention: (1) the acidity of the protonic or Lewis acid generated; (2) the degree of ion-pair separation in the propagating cationic chain; and, (3) the susceptibility of the anions to fluoride abstraction and consequent chain termination.

In certain embodiments of the composition, the photoinitiator may comprise or consist of a photobase generator: upon exposure to UV radiation—typically in the wavelength from 320 to 420 nm—said photobase generator releases an amine, which catalyzes an addition of the reactive groups. The photobase generator is not specifically limited so long as it generates an amine directly or indirectly with light irradiation. However, suitable photobase generators which may be mentioned include: benzyl carbamates; benzoin carbamates; o-carbamoylhydroxyamines; O-carbamoyloximes; aromatic sulfonamides; alpha-lactams; N-(2-allylethenyl)amides; arylazide compounds, N-arylformamides, and 4-(ortho-nitrophenyl)dihydropyridines. As an exemplary photobase generator mention may be made of: 1,2-Diisopropyl-3-[Bis(dimethylamino)methylene guanidium 2-(3-benzoylphenyl) propionate, available from Fujifilm Wako Pure Chemical Corporation.

For completeness, the preparation of photobase generator compounds is known in the art and instructive references include: J. Cameron et al., Journal of the American Chemical Society, Vol. 113, No. 11, 4303-4313 (1991); J. Cameron et al., J. Polym. Mater. Sci. Eng., 64, 55 (1991); J. Cameron et al., J. Org. Chem., 55, 5919-5922 (1990); Sun et al., Journal of the American Chemical Society (2008), 130 (26), 8130-8131; Suyama et al., Progress in Polymer Science (2009), 34 (2), 194-209; Arimitsu et al., Journal of Photopolymer Science and Technology (2010), 23, 135-136; Kobayashi et al., Journal of Photopolymer Science and Technology (2018), 31, 107-112; and, U.S. Pat. No. 5,650,261 (Winkel). Moreover, photobase generators are further described in: M. Shirai et al. *Photochemical Reactions of Quatenary Ammonium Dithiocarbamates as Photobase Generators and Their Use in The Photoinitiated Thermal Crosslinking of Poly (gycidylmethacrylate)*, Journal of Polymer Science, Part A: Polymer Chemistry, Vol. 39, pp. 1329-1341 (2001); and, M. Shirai et al., *Photoacid and photobase generators: chemistry and applications to polymeric materials, Progress in Polymer Science, Vol.* 21, pp. 1-45, XP-002299394, 1996.

It is noted that photo-curable compositions of the present invention are, in certain important embodiments, free-radically polymerizable. In particular, compounds possessing a free-radically active, unsaturated group—such as an acrylate compound, a (meth)acrylate compound, an epoxy-functional acrylate, an epoxy functional (meth)acrylate, a polyurethane acrylate or a combination thereof—are polymerizable by a free-radical polymerization mechanism. Applying an election of those compounds, the preferred photoinitiator compounds would be photoactive compounds that generate free radicals that can initiate polymerization by addition to the C=C double bonds.

Photoinitiators for use in this embodiment should be selected from Norrish type I and Norrish type II photoinitiators. A Norrish type I radical photoinitiator undergoes the Norrish type I reaction when exposed to actinic radiation: said reaction is defined by IUPAC as α-cleavage of an excited carbonyl compound leading to an acyl-alkyl radical pair (from an acyclic carbonyl compound) or an acyl-alkyl biradical (from a cyclic carbonyl compound) as a primary photoproduct. A Norrish type II radical photoinitiator undergoes the Norrish type II reaction when exposed to actinic radiation: that reaction is defined by IUPAC as the photochemical abstraction of a γ-hydrogen by an excited carbonyl compound to produce a 1,4-biradical as a primary photoproduct.

Non limiting examples of photoactive compounds that undergo a Norrish I cleavage include but are not limited to: 2-methyl-1[4-(methylthio)phenyl]-2-morpholinopropan-1- one (Irgacure 907, available from BASF); 2-benzyl-2-dimethylamino-1-(4-morpholinophenyl)-butanone-1 (Irgacure 369); and, 2-(dimethylamino)-2-[(4-methylphenyl)methyl]-1-[4-(4-morpholinyl)phenyl]-1-butanone (Irgacure 379). Non limiting examples of photoactive compounds that undergo a Norrish II reaction include but are not limited to: bis(2,6-dimethylbenzoyl)-2,4,4-trimethylpentylphosphine oxide (Irgacure 1800, 1850, and 1700); 2,4,6-trimethylbenzoyl-diphenylphosphine oxide (Lucerin TPO, available from BASF); ethyl (2,4,6-trimethylbenzoyl)-phenylphosphinate (Lucerin TPO-L); bis(2,4,6-trimethylbenzoyl)-phenylphosphine oxide; isopropyl thioxanthone; diethyl thioxanthone; and, 2-chlorothioxanthone. It is noted that Norrish Type II photoinitiators often require the presence of a suitable co-initiator—typically an amine, such as 2-dimethylamino-ethylbenzoate—and for this reason a preference for Norrish type I photoinitiators may be acknowledged.

In toto photoinitiator b) should be present in the photocurable composition in amount of from 0.1 to 10 wt. %, for example from 0.5 to 5.0 wt. % or from 0.5 to 2.5 wt. %, based on the total weight of the composition.

The purpose of irradiation is to generate the active species from the photoinitiator which initiates the cure reactions. Once that species is generated, the cure chemistry is subject to the same rules of thermodynamics as any chemical reaction: the reaction rate may be accelerated by heat. The practice of using thermal treatments to enhance the cationic UV cure of monomers is generally known in the art, with an illustrative instructive reference being Crivello et al., "*Dual Photo-and thermally initiated cationic polymerization of epoxy monomers*," Journal of Polymer Science A, Polymer Chemistry., Vol. 44, Issue: 23, pp. 6750-6764, (Dec. 1, 2006).

As would be recognized by the skilled artisan, photosensitizers can be incorporated into the compositions to improve the efficiency with which the photoinitiator b) uses the energy delivered. The term "photosensitizer" is used in accordance with its standard meaning to represent any substance that either increases the rate of photoinitiated polymerization or shifts the wavelength at which polymerization occurs: Odian, *Principles of Polymerization* 3rd Edition (1991), Page 222 provides an instructive reference in this regard. When present, photosensitizers should be used in an amount of from 5 to 25 wt. %, based on the weight of the photoinitiator c).

The use of the photoinitiator b)—and where applicable a photosensitizer—may produce residue compounds from the photochemical reaction in the final cured product. The residues may be detected by conventional analytical techniques such as: infrared, ultraviolet and NMR spectroscopy; gas or liquid chromatography; and, mass spectroscopy. Thus, the present invention may comprise cured matrix (co-)polymers and detectable amounts of residues from at least the photoinitiator. Such residues are present in small amounts and do not normally interfere with the desired physiochemical properties of the final cured product.

Part c): Carbon Nanostructures

The photocurable composition of the present invention is conventionally characterized by comprising, based on the weight of the composition, from 0.01 to 1 wt. % of c) carbon nanostructures (CNSs, singular CNS), for example, from 0.01 to 1.5 wt. %, from 0.01 to 1 wt. %, 0.02 to 0.5 wt. %, or 0.02 to 0.08 wt. %

The term carbon nanostructures refers herein to a plurality of carbon nanotubes (CNTs) that that are crosslinked in a polymeric structure by being branched, e.g., in a dendritic fashion, interdigitated, entangled and/or sharing common walls with one another. Operations conducted to prepare the compositions described herein can generate CNS-derived materials such as CNS fragments, fractured CNTs, dispersed CNSs, and/or elongated CNS strands. Fragments of CNSs are derived from CNSs and, like the larger CNS, include a plurality of CNTs that are crosslinked in a polymeric structure by being branched, interdigitated, entangled and/or sharing common walls. Fractured CNTs are derived from CNSs and are branched and share common walls with one another. Elongated CNS strands are structures derived from CNSs (including from fragments of CNSs and fractured CNTs) in which the component CNTs have been displaced linearly with respect to each other. Preferably, the operations conducted to prepare the compositions described herein generate dispersed CNSs that are more completely exfoliated, and they may retain junctions and intersections between the component CNTs that were created during production of the CNSs.

Highly entangled CNSs are macroscopic in size and can be considered to have a carbon nanotube (CNT) as a base monomer unit of its polymeric structure. For many CNTs in the CNS structure, at least a portion of a CNT sidewall is shared with another CNT. While it is generally understood that every carbon nanotube in the CNS need not necessarily be branched, crosslinked, or share common walls with other CNTs, at least a portion of the CNTs in the carbon nanostructure can be interdigitated with one another and/or with branched, crosslinked, or common-wall-sharing carbon nanotubes in the remainder of the carbon nanostructure.

As known in the art, carbon nanotubes (CNT or CNTs plural) are carbonaceous materials that include at least one sheet of $sp^2$-hybridized carbon atoms bonded to each other to form a honey-comb lattice that forms a cylindrical or tubular structure. The carbon nanotubes can be single-walled carbon nanotubes (SWCNTs) or multi-walled carbon nanotubes (MWCNTs). SWCNTs can be thought of as an allotrope of $sp^2$-hybridized carbon similar to fullerenes. The structure is a cylindrical tube including six-membered carbon rings. Analogous MWCNTs, on the other hand, have several tubes in concentric cylinders. The number of these concentric walls may vary, e.g., from 2 to 25 or more. Typically, the diameter of MWNTs may be 10 nm or more, in comparison to 0.7 to 2.0 nm for typical SWNTs.

In many of the CNSs used in this invention, the CNTs are MWCNTs, having, for instance, at least two coaxial carbon nanotubes. The number of walls present, as determined, for example, by transmission electron microscopy (TEM), at a magnification sufficient for analyzing the number of wall in a particular case, can be within the range of from 2 to 30 or so, for example: 4 to 30; 6 to 30; 8 to 30; 10 to 30; 12 to 30; 14 to 30; 16 to 30; 18 to 30; 20 to 30; 22 to 30; 24 to 30; 26 to 30; 28 to 30; or 2 to 28; 4 to 28; 6 to 28; 8 to 28; 10 to 28; 12 to 28; 14 to 28; 16 to 28; 18 to 28; 20 to 28; 22 to 28; 24 to 28; 26 to 28; or 2 to 26; 4 to 26; 6 to 26; 8 to 26; 10 to 26; 12 to 26; 14 to 26; 16 to 26; 18 to 26; 20 to 26; 22 to 26; 24 to 26; or 2 to 24; 4 to 24; 6 to 24; 8 to 24; 10 to 24; 12 to 24; 14 to 24; 16 to 24; 18 to 24; 20 to 24; 22 to 24; or 2 to 22; 4 to 22; 6 to 22; 8 to 22; 10 to 22; 12 to 22; 14 to 22; 16 to 22; 18 to 22; 20 to 22; or 2 to 20; 4 to 20; 6 to 20; 8 to 20; 10 to 20; 12 to 20; 14 to 20; 16 to 20; 18 to 20; or 2 to 18; 4 to 18; 6 to 18; 8 to 18; 10 to 18; 12 to 18; 14 to 18; 16 to 18; or 2 to 16; 4 to 16; 6 to 16; 8 to 16; 10 to 16; 12 to 16; 14 to 16; or 2 to 14; 4 to 14; 6 to 14; 8 to 14; 10 to 14; 12 to 14; or 2 to 12; 4 to 12; 6 to 12; 8 to 12; 10 to 12; or 2 to 10; 4 to 10; 6 to 10; 8 to 10; or 2 to 8; 4 to 8; 6 to 8; or 2 to 6; 4 to 6; or 2 to 4.

Since a CNS is a polymeric, highly branched and cross-linked network of CNTs, at least some of the chemistry observed with individualized CNTs may also be carried out on the CNS. In addition, some of the attractive properties often associated with using CNTs also are displayed in materials that incorporate CNSs. These include, for example, electrical conductivity, attractive physical properties including maintaining or enabling good tensile strength when integrated into a polymer composition, thermal stability (sometimes comparable to that of diamond crystals or in-plane graphite sheets) and/or chemical stability, to name a few.

However, as used herein, the term "CNS" is not a synonym for individualized, un-entangled structures such as "monomeric" fullerenes (the term "fullerene" broadly referring to an allotrope of carbon in the form of a hollow sphere, ellipsoid, tube, e.g., a carbon nanotube, and other shapes). In fact, many embodiments of the invention highlight differences and advantages observed or anticipated with the use of CNSs as opposed to the use of their CNTs building blocks. Without wishing to be held to a particular interpretation, it is believed that the combination of branching, crosslinking, and wall sharing among the carbon nanotubes in a CNS reduces or minimizes the van der Waals forces that are often problematic when using individual carbon nanotubes in a similar manner, especially when it is desirable to prevent agglomeration.

In addition, or alternatively to performance attributes, CNTs that are part of or are derived from a CNS can be characterized by a number of features, at least some of which can be relied upon to distinguish them from other nanomaterials, such as, for instance, ordinary CNTs (namely CNTs that are not derived from CNSs and can be provided as individualized, pristine or fresh CNTs).

In many cases, a CNT present in or derived from a CNS has a typical diameter of 100 nanometers (nm) or less, such as, for example, within the range of from about 5 to about 100 nm, e.g., within the range of from about 10 to about 75, from about 10 to about 50, from about 10 to about 30, from about 10 to about 20 nm.

In specific embodiments, at least one of the CNTs has a length that is equal to or greater than 2 microns, as determined by SEM. For example, at least one of the CNTs will have a length within a range of from 2 to 2.25 microns; from 2 to 2.5 microns; from 2 to 2.75 microns; from 2 to 3.0 microns; from 2 to 3.5 microns; from 2 to 4.0 microns; or from 2.25 to 2.5 microns; from 2.25 to 2.75 microns; from 2.25 to 3 microns; from 2.25 to 3.5 microns; from 2.25 to 4 microns; or from 2.5 to 2.75 microns; from 2.5 to 3 microns; from 2.5 to 3.5 microns; from 2.5 to 4 microns; or from 3 to 3.5 microns; from 3 to 4 microns; of from 3.5 to 4 microns or higher. In some embodiments, more than one, e.g., a portion such as a fraction of at least about 0.1%, at least about 1%, at least about 10%, at least about 15%, at least about 20%, at least about 25%, at least about 30%, at least about 35%, at least about 40, at least about 45%, at least about 50% or even more than one half, of the CNTs, as determined by SEM, can have a length greater than 2 microns, e.g., within the ranges specified above.

The morphology of CNTs present in a CNS, in a fragment of a CNS or in a fractured CNT derived from a CNS will often be characterized by a high aspect ratio, with lengths typically more than 100 times the diameter, and in certain cases much higher. For instance, in a CNS (or CNS fragment), the length to diameter aspect ratio of CNTs can be within a range of from about 200 to about 1000, such as, for instance, from 200 to 300; from 200 to 400; from 200 to 500; from 200 to 600; from 200 to 700; from 200 to 800; from 200 to 900; or from 300 to 400; from 300 to 500; from 300 to 600; from 300 to 700; from 300 to 800; from 300 to 900; from 300 to 1000; or from 400 to 500; from 400 to 600; from 400 to 700; from 400 to 800; from 400 to 900; from 400 to 1000; or from 500 to 600; from 500 to 700; from 500 to 800; from 500 to 900; from 500 to 1000; or from 600 to 700; from 600 to 800; from 600 to 900; from 600 to 1000; from 700 to 800; from 700 to 900; from 700 to 1000; or from 800 to 900; from 800 to 1000; or from 900 to 1000.

It has been found that in CNSs, as well as in structures derived from CNSs (e.g., in fragments of CNSs or in fractured CNTs or elongated CNS strands or dispersed CNSs) at least one of the CNTs is characterized by a certain "branch density". As used herein, the term "branch" refers to a feature in which a single carbon nanotube diverges into multiple (two or more), connected multiwall carbon nanotubes. One embodiment has a branch density according to which, along a two-micrometer length of the carbon nanostructure, there are at least two branches, as determined by SEM. Three or more branches also can occur.

Further features (detected using TEM or SEM, for example) can be used to characterize the type of branching found in CNSs relative to structures such as Y-shaped CNTs that are not derived from CNSs. For instance, whereas Y-shaped CNTs, have a catalyst particle at or near the area (point) of branching, such a catalyst particle is absent at or near the area of branching occurring in CNSs, fragments of CNSs, fractured CNTs, elongated CNS strands, or dispersed CNSs.

In addition, or in the alternative, the number of walls observed at the area (point) of branching in a CNS, fragment of CNS, fractured CNTs, or dispersed CNSs differ from one side of the branching (e.g., before the branching point) to the other side of this area (e.g., after or past the branching point). Such a change in in the number of walls, also referred to herein as an "asymmetry" in the number of walls, is not observed with ordinary Y-shaped CNTs (where the same number of walls is observed in both the area before and the area past the branching point).

Figure 1B:
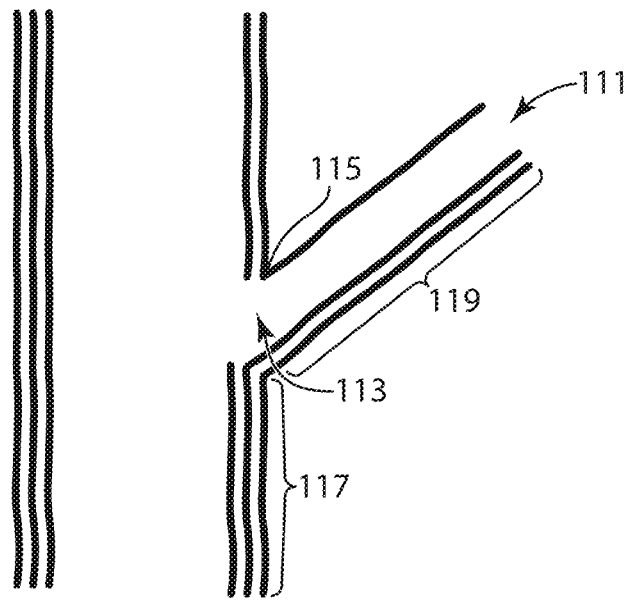

Diagrams illustrating these features are provided in FIGS. 1A and 1B. Shown in FIG. 1A, is an exemplary Y-shaped CNT 11 that is not derived from a CNS. Y-shaped CNT 11 includes catalyst particle 13 at or near branching point 15. Areas 17 and 19 are located, respectively, before and after the branching point 15. In the case of a Y-shaped CNT such as Y-shaped CNT 11, both areas 17 and 19 are characterized by the same number of walls, i.e., two walls in the drawing.

In contrast, in a CNS (FIG. 1B), a CNT building block 111, that branches at branching point 115, does not include a catalyst particle at or near this point, as seen at catalyst devoid region 113. Furthermore, the number of walls present in region 117, located before, prior (or on a first side of) branching point 115 is different from the number of walls in region 119 (which is located past, after or on the other side relative to branching point 115. In more detail, the three-walled feature found in region 117 is not carried through to region 119 (which in the diagram of FIG. 1B has only two walls), giving rise to the asymmetry mentioned above.

Figure 2A:
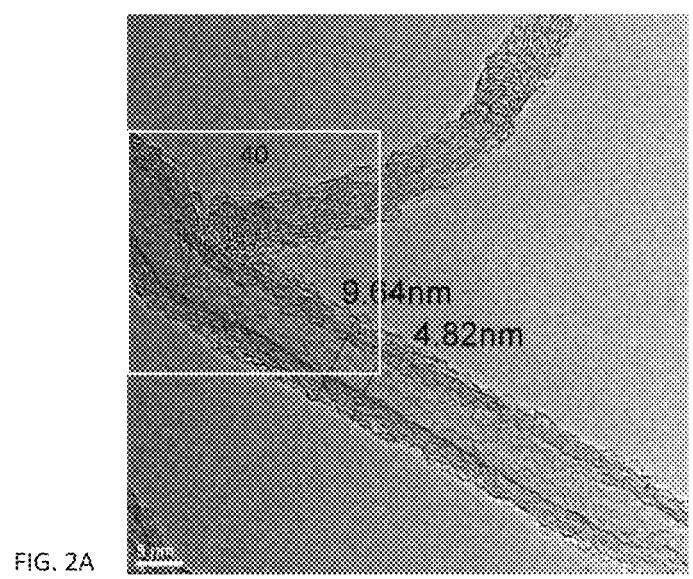
FIGS. 2A and 2B are TEM images showing features characterizing multiwall carbon nanotubes found in carbon nanostructures.
Figure 2B:
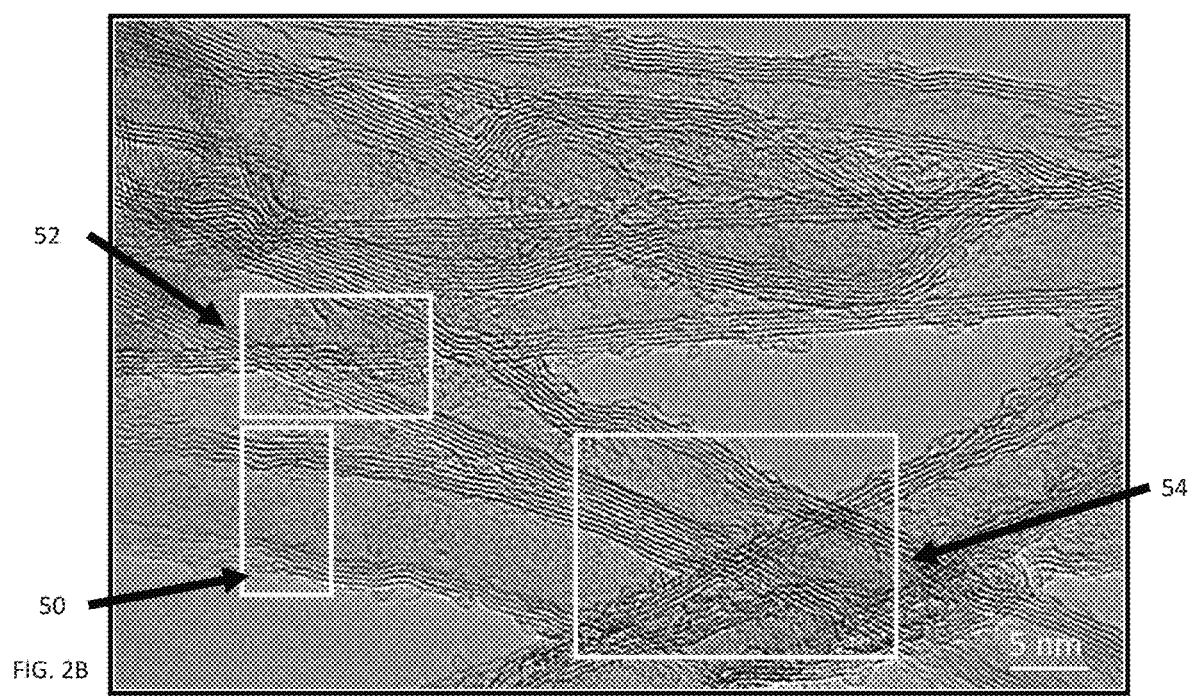

These features are highlighted in the TEM images of FIGS. 2A and 2B.

In more detail, the CNS branching in TEM region 40 of FIG. 2A shows the absence of any catalyst particle. In the TEM of FIG. 2B, first channel 50 and second channel 52 point to the asymmetry in the number of walls featured in branched CNSs, while arrow 54 points to a region displaying wall sharing.

One, more, or all these attributes can be encountered in the monomer compositions and three dimensional objects described herein.

Suitable techniques for preparing CNSs are described, for example, in U.S. Patent Application Publication No. 2014/0093728 A1, published on Apr. 3, 2014, U.S. Pat. Nos. 8,784,937B2; 9,005,755B2; 9,107,292B2; and 9,447,259B2. The entire contents of these documents are incorporated herein by this reference.

As described in these documents, a CNS can be grown on a suitable substrate, for example on a catalyst-treated fiber material. The product can be a fiber-containing CNS material. In some cases, the CNSs is separated from the substrate to form flakes.

As seen in US 2014/0093728A1 a carbon nanostructure obtained as a flake material (i.e., a discrete particle having finite dimensions) exists as a three-dimensional microstructure due to the entanglement and crosslinking of its highly aligned carbon nanotubes. The aligned morphology is reflective of the formation of the carbon nanotubes on a growth substrate under rapid carbon nanotube growth conditions (e.g., several microns per second, such as about 2 microns per second to about 10 microns per second), thereby inducing substantially perpendicular carbon nanotube growth from the growth substrate. Without being bound by any theory or mechanism, it is believed that the rapid rate of carbon nanotube growth on the growth substrate can contribute, at least in part, to the complex structural morphology of the carbon nanostructure. In addition, the bulk density of the CNS can be modulated to some degree by adjusting the carbon nanostructure growth conditions, including, for example, by changing the concentration of transition metal nanoparticle catalyst particles that are disposed on the growth substrate to initiate carbon nanotube growth.

The flakes can be further processed, e.g., by cutting or fluffing (operations that can involve mechanical ball milling, grinding, blending, etc.), chemical processes, or any combination thereof.

In some embodiments, the CNSs employed are "coated", also referred to herein as "sized" or "encapsulated" CNSs. In a typical sizing process, the coating is applied onto the CNTs that form the CNS. The sizing process can form a partial or a complete coating that is non-covalently bonded to the CNTs and, in some cases, can act as a binder. In addition, or in the alternative, the size can be applied to already formed CNSs in a post-coating (or encapsulation) process. With sizes that have binding properties, CNSs can be formed into larger structures, granules or pellets, for example. In other embodiments the granules or pellets are formed independently of the function of the sizing.

Coating amounts can vary. For instance, relative to the overall weight of the coated CNS material, the coating can be within the range of from about 0.1 weight % to about 10 weight % (e.g., within the range, by weight, of from about 0.1% to about 0.5%; from about 0.5% to about 1%; from about 1% to about 1.5%; from about 1.5% to about 2%; from about 2% to about 2.5%; from about 2.5% to about 3%; from about 3% to about 3.5%; from about 3.5% to about 4%; from about 4% to about 4.5%; from about 4.5% to about 5%; from about 5% to about 5.5%; from about 5.5% to about 6%; from about 6% to about 6.5%; from about 6.5% to about 7%; from about 7% to about 7.5%; from about 7.5% to about 8%; from about 8% to about 8.5%; from about 8.5% to about 9%; from about 9% to about 9.5%; or from about 9.5% to about 10%.

Various types of coatings can be selected. In many cases, sizing solutions commonly used in coating carbon fibers or glass fibers could also be utilized to coat CNSs. Specific examples of coating materials include but are not limited to fluorinated polymers such as poly(vinyldifluoroethylene) (PVDF), poly(vinyldifluoroethylene-co-hexafluoropropylene) (PVDF-HFP), poly(tetrafluoroethylene) (PTFE), polyimides, and water-soluble binders, such as poly(ethylene) oxide, polyvinyl-alcohol (PVA), cellulose, carboxymethylcellulose (CMC), starch, hydroxypropylcellulose, regenerated cellulose, polyvinyl pyrrolidone (PVP), and copolymers and mixtures thereof. In many implementations, the CNSs used are treated with a polyurethane (PU), a thermoplastic polyurethane (TPU), or with polyethylene glycol (PEG).

Polymers such as, for instance, epoxy, polyester, vinylester, polyetherimide, polyetherketoneketone, polyphthalamide, polyetherketone, polyetheretherketone, polyimide, phenol-formaldehyde, bismaleimide, acrylonitrile-butadiene styrene (ABS), polycarbonate, polyethyleneimine, polyurethane, polyvinyl chloride, polystyrene, polyolefins, polypropylenes, polyethylenes, polytetrafluoroethylene, elastomers such as, for example, polyisoprene, polybutadiene, butyl rubber, nitrile rubber, ethylene-vinyl acetate polymers, siloxane-based polymers including those described below, and fluorosilicone polymers, combinations thereof, or other polymers or polymeric blends can also be used in some cases. In order to enhance electrical conductivity, conductive polymers such as, for instance, polyanilines, polypyrroles and polythiophenes can also be used.

The coating material may be selected to contribute particular properties to the monomer composition or three dimensional object or because of its dispersibility, compatibility, and/or miscibility with the resin component of the monomer composition. Some implementations employ coating materials that can assist in stabilizing a CNS dispersion in a monomer or resin formulation as described herein.

In many implementations, the CNSs are separated from their growth substrate and can be provided in the form of a loose particulate material (such as CNS flakes, granules, pellets, etc., for example) or in compositions that also include a coating or encapsulant and/or in the form of a granule or pellet. Specific embodiments described herein employ CNS-materials that have a 97% or higher CNT purity. Alternatively, CNS materials may include some amount of the growth substrate where it is desirable to include glass fibers in the composition.

Figure 3A:
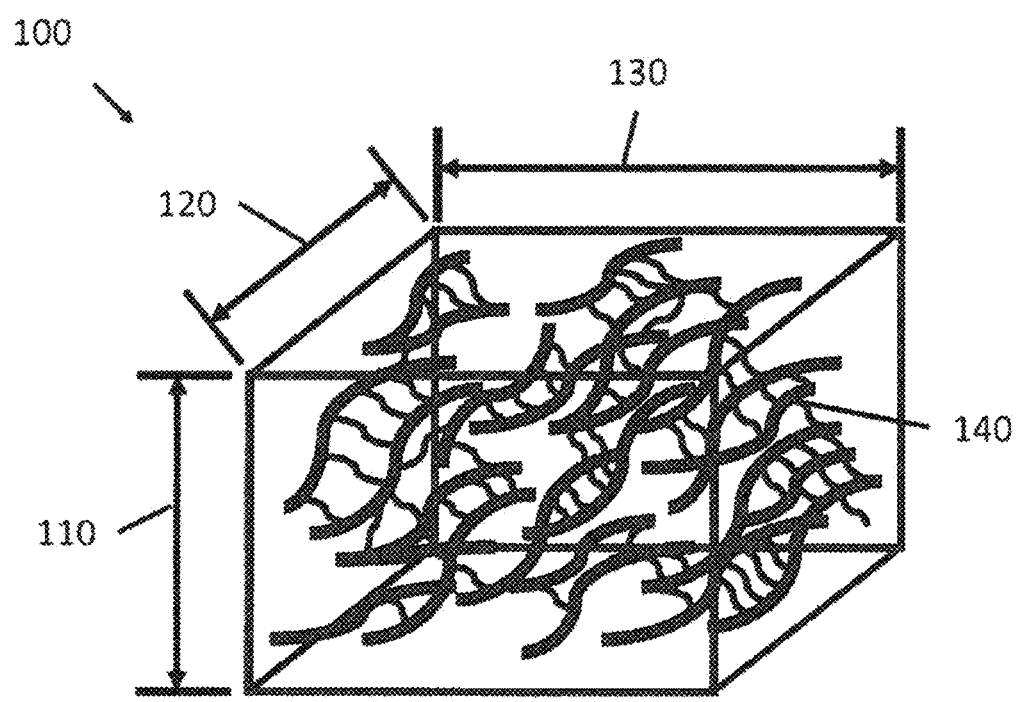
FIG. 3A is an illustrative depiction of a carbon nanostructure flake material after isolation of the carbon nanostructure from a growth substrate.

In some embodiments, the CNSs are provided in the form of a flake material after being removed from the growth substrate upon which the carbon nanostructures are initially formed. As used herein, the term "flake material" refers to a discrete particle having finite dimensions. Shown in FIG. 3A, for instance, is an illustrative depiction of a CNS flake material after isolation of the CNS from a growth substrate. Flake structure 100 can have first dimension 110 that is in a range from about 1 nm to about 35 μm thick, particularly about 1 nm to about 500 nm thick, including any value in between and any fraction thereof. Flake structure 100 can have second dimension 120 that is in a range from about 1 micron to about 750 microns tall, including any value in between and any fraction thereof. Flake structure 100 can have third dimension 130 that can be in a range from about 1 micron to about 750 microns, including any value in between and any fraction thereof. Two or all of dimensions 110, 120 and 130 can be the same or different.

For example, in some embodiments, second dimension 120 and third dimension 130 can be, independently, on the order of about 1 micron to about 10 microns, or about 10 microns to about 100 microns, or about 100 microns to about 250 microns, from about 250 to about 500 microns, or from about 500 microns to about 750 microns.

CNTs within the CNS can vary in length from about 10 nanometers (nm) to about 750 microns (μm), or higher. Thus, the CNTs can be from 10 nm to 100 nm, from 10 nm to 500 nm; from 10 nm to 750 nm; from 10 nm to 1 micron; from 10 nm to 1.25 micron; from 10 nm to 1.5 micron; from 10 nm to 1.75 micron; from 10 nm to 2 micron; or from 100 nm to 500 nm, from 100 nm to 750 nm; from 100 nm to 1 micron; from 100 to 1.25 micron; from 100 to 1.5 micron; from 100 to 1.75 micron from 100 to 2 microns; from 500 nm to 750 nm; from 500 nm to 1 micron; from 500 nm to 1 micron; from 500 nm to 1.25 micron; from 500 nm to 1.5 micron; from 500 nm to 1.75 micron; from 500 nm to 2 micron; from 750 nm to 1 micron; from 750 nm to 1.25 micron; from 750 nm to 1.5 micron; from 750 nm to 1.75 microns; from 750 nm to 2 microns; from 1 micron to 1.25 micron; from 1.0 micron to 1.5 micron; from 1 micron to 1.75 micron; from 1 micron to 2 microns; or from 1.25 micron to 1.5 micron; from 1.25 micron to 1.75 micron; from 1 micron to 2 microns; or from 1.5 to 1.75 micron; from 1.5 to 2 micron; or from 1.75 to 2 microns. In some embodiments, at least one of the CNTs has a length that is equal to or greater than 2 microns, as determined by SEM.

Figure 3B:
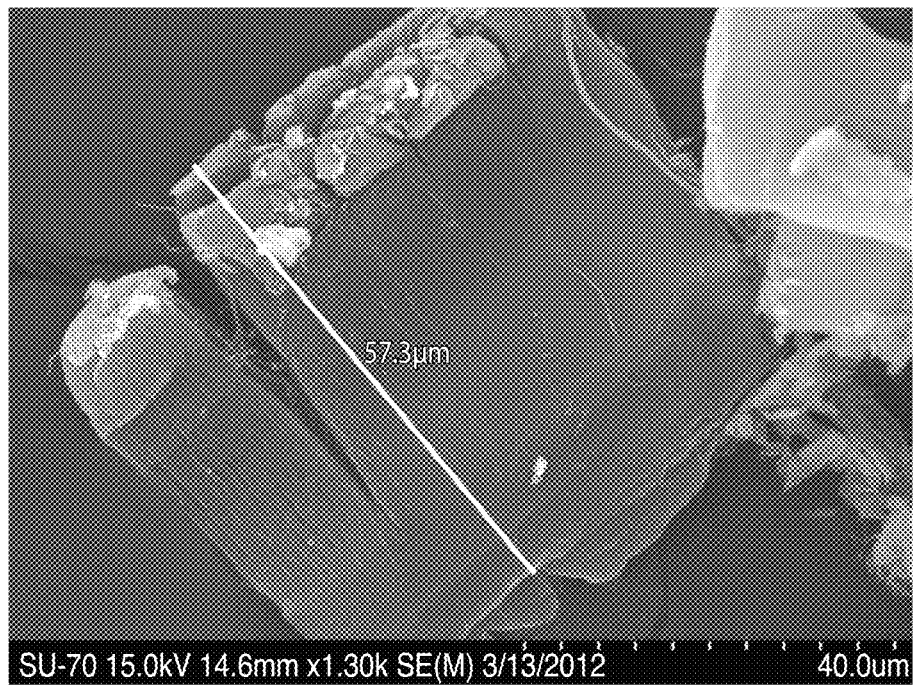
FIG. 3B is a SEM image of an illustrative carbon nanostructure obtained as a flake material.

Shown in FIG. 3B is a SEM image of an illustrative carbon nanostructure obtained as a flake material. The carbon nanostructure shown in FIG. 3B exists as a three-dimensional microstructure due to the entanglement and crosslinking of its highly aligned carbon nanotubes. The aligned morphology is reflective of the formation of the carbon nanotubes on a growth substrate under rapid carbon nanotube growth conditions (e.g., several microns per second, such as about 2 microns per second to about 10 microns per second), thereby inducing substantially perpendicular carbon nanotube growth from the growth substrate. Without being bound by any theory or mechanism, it is believed that the rapid rate of carbon nanotube growth on the growth substrate can contribute, at least in part, to the complex structural morphology of the carbon nanostructure. In addition, the bulk density of the carbon nanostructure can be modulated to some degree by adjusting the carbon nanostructure growth conditions, including, for example, by changing the concentration of transition metal nanoparticle catalyst particles that are disposed on the growth substrate to initiate carbon nanotube growth.

A flake structure can include a webbed network of carbon nanotubes in the form of a carbon nanotube polymer (i.e., a "carbon nanopolymer") having a molecular weight in a range from about 15,000 g/mol to about 150,000 g/mol, including all values in between and any fraction thereof. In some cases, the upper end of the molecular weight range can be even higher, including about 200,000 g/mol, about 500,000 g/mol, or about 1,000,000 g/mol. The higher molecular weights can be associated with carbon nanostructures that are dimensionally long. The molecular weight can also be a function of the predominant carbon nanotube diameter and number of carbon nanotube walls present within the carbon nanostructure. The crosslinking density of the carbon nanostructure can range between about 2 mol/cm$^3$ to about 80 mol/cm$^3$. Typically, the crosslinking density is a function of the carbon nanostructure growth density on the surface of the growth substrate, the carbon nanostructure growth conditions and so forth. It should be noted that the typical CNS structure, containing many, many CNTs held in an open web-like arrangement, removes Van der Waals forces or diminishes their effect. This structure can be exfoliated more easily, which makes many additional steps of separating them or breaking them into branched structures unique and different from ordinary CNTs.

With a web-like morphology, carbon nanostructures can have relatively low bulk densities. As-produced carbon nanostructures can have an initial bulk density ranging from about 0.003 g/cm$^3$ to about 0.015 g/cm$^3$. Further consolidation and/or coating to produce a carbon nanostructure flake material or like morphology can raise the bulk density to a range from about 0.1 g/cm$^3$ to about 0.15 g/cm$^3$. In some embodiments, optional further modification of the carbon nanostructure can be conducted to further alter the bulk density and/or another property of the carbon nanostructure. In some embodiments, the bulk density of the carbon nanostructure can be further modified by forming a coating on the carbon nanotubes of the carbon nanostructure and/or infiltrating the interior of the carbon nanostructure with various materials. Coating the carbon nanotubes and/or infiltrating the interior of the carbon nanostructure can further tailor the properties of the carbon nanostructure for use in various applications. Moreover, forming a coating on the carbon nanotubes can desirably facilitate the handling of the carbon nanostructure. Further compaction can raise the bulk density to an upper limit of about 1 g/cm$^3$, with chemical modifications to the carbon nanostructure raising the bulk density to an upper limit of about 1.2 g/cm$^3$.

In addition to the flakes described above, the CNS material can be provided as granules, pellets, or in other forms of loose particulate material, having a typical particle size within the range of from about 1 mm to about 1 cm, for example, from about 0.5 mm to about 1 mm, from about 1 mm to about 2 mm, from about 2 mm to about 3 mm, from about 3 mm to about 4 mm, from about 4 mm to about 5 mm, from about 5 mm to about 6 mm, from about 6 mm to about 7 mm, from about 7 mm to about 8 mm, from about 8 mm to about 9 mm or from about 9 mm to about 10 mm.

Commercially, examples of suitable CNS materials are those available from Applied Nanostructured Solutions LLC (ANS) (Massachusetts, USA), a wholly owned subsidiary of Cabot Corporation.

The CNSs used herein can be identified and/or characterized by various techniques. Electron microscopy, including techniques such as transmission electron microscopy (TEM) and scanning electron microscopy (SEM), for example, can provide information about features such as the frequency of specific number of walls present, branching, the absence of catalyst particles, etc. See, e.g., FIGS. 2A-2B.

Raman spectroscopy can point to bands associated with impurities. For example, a D-band (around 1350 cm$^{-1}$) is associated with amorphous carbon; a G band (around 1580 cm$^{-1}$) is associated with crystalline graphite or CNTs). A G' band (around 2700 cm$^{-1}$) is expected to occur at about 2× the frequency of the D band. In some cases, it may be possible to discriminate between CNS and CNT structures by thermogravimetric analysis (TGA).

Part d): Further Components of the Compositions

The photocurable compositions of the present invention may, of course, also contain additives and adjunct ingredients. Such additives and adjunct ingredients are necessarily minor components of the present compositions and may conventionally be selected from: fillers; solvents; reactive diluents; corrosion inhibitors; catalysts; antioxidants; UV absorbers/light stabilizers; metal deactivators; antistatic agents; reinforcers; antifogging agents; propellants; biocides; plasticizers; lubricants; emulsifiers; dyes; pigments; rheological agents; impact modifiers; adhesion regulators; optical brighteners; flame retardants; anti-drip agents; nucleating agents; wetting agents; thickeners; protective colloids;

defoamers; tackifiers; and, mixtures thereof. The choice of appropriate additives is limited only in that these must be compatible with the other components of the composition and cannot be deleterious to either the use of the composition in printing applications or the physical properties of the product upon curing. If applicable, the additives may be disposed in either part ((A) or (B)) of a two component (2K) composition.

A "plasticizer" for the purposes of this invention is a substance that decreases the viscosity of the composition and thus facilitates its processability. Herein the plasticizer may constitute up to 40 wt. % or up to 20 wt. %, based on the total weight of the composition, and is preferably selected from the group consisting of: polydimethylsiloxanes (PDMS); diurethanes; ethers of monofunctional, linear or branched C4-C16 alcohols, such as Cetiol OE (obtainable from Cognis Deutschland GmbH, Düsseldorf); esters of abietic acid, butyric acid, thiobutyric acid, acetic acid, propionic acid esters and citric acid; esters based on nitrocellulose and polyvinyl acetate; fatty acid esters; dicarboxylic acid esters; esters of OH-group-carrying or epoxidized fatty acids; glycolic acid esters; benzoic acid esters; phosphoric acid esters; sulfonic acid esters; trimellitic acid esters; epoxidized plasticizers; polyether plasticizers, such as end-capped polyethylene or polypropylene glycols; polystyrene; hydrocarbon plasticizers; chlorinated paraffin; and, mixtures thereof. It is noted that, in principle, phthalic acid esters can be used as the plasticizer but these are not preferred due to their toxicological potential. A less toxic plasticizer comprises or consists of one or more polydimethylsiloxane (PDMS) polymers.

"Stabilizers" for purposes of this invention are to be understood as antioxidants, UV stabilizers or hydrolysis stabilizers. Herein stabilizers may constitute in toto up to 10 wt. % or up to 5 wt. %, based on the total weight of the composition. Standard commercial examples of stabilizers suitable for use herein include: sterically hindered phenols; thioethers; benzotriazoles; benzophenones; benzoates; cyanoacrylates; acrylates; amines of the hindered amine light stabilizer (HALS) type; phosphorus; sulfur; and, mixtures thereof.

Those compositions of the present invention may optionally contain a toughening rubber which is desirably present in the form of a rubber-modified epoxy resin, in the form of core-shell particles or a combination thereof. The toughening rubber should have a glass transition temperature ($T_g$) of no greater than −25° C.: preferably at least a portion of the toughening rubber should have a glass transition temperature ($T_g$) of −40° C. or lower, more preferably −50° C. or lower and even more preferably −70° C. or lower.

As noted, the compositions according to the present invention can additionally contain fillers. Suitable here are, for example, chalk, lime powder, precipitated and/or pyrogenic silicic acid, zeolites, bentonites, magnesium carbonate, diatomite, alumina, clay, talc, titanium oxide, iron oxide, zinc oxide, sand, quartz, flint, mica, glass powder, and other ground mineral substances. Organic fillers can also be used, in particular carbon black, graphite, wood fibers, wood flour, sawdust, cellulose, cotton, pulp, cotton, wood chips, chopped straw, chaff, ground walnut shells, and other chopped fibers. Short fibers such as glass fibers, glass filament, polyacrylonitrile, carbon fibers, Kevlar fibers, or polyethylene fibers can also be added. Aluminum powder is likewise suitable as a filler.

The pyrogenic and/or precipitated silicic acids advantageously have a BET surface area from 10 to 90 $m^2/g$. When they are used, they do not cause any additional increase in the viscosity of the composition according to the present invention, but do contribute to strengthening the cured composition.

It is likewise conceivable to use pyrogenic and/or precipitated silicic acids having a higher BET surface area, advantageously from 100 to 250 $m^2/g$, in particular from 110 to 170 $m^2/g$, as a filler: because of the greater BET surface area, the effect of strengthening the cured composition is achieved with a smaller proportion by weight of silicic acid.

Also suitable as fillers are hollow spheres having a mineral shell or a plastic shell. These can be, for example, hollow glass spheres that are obtainable commercially under the trade names Glass Bubbles®. Plastic-based hollow spheres, such as Expancel® or Dualite®, may be used and are described in EP 0 520 426 B1: they are made up of inorganic or organic substances and each have a diameter of 1 mm or less, preferably 500 μm or less.

Fillers which impart thixotropy to the composition may be preferred for many applications: such fillers are also described as rheological adjuvants, e.g. hydrogenated castor oil, fatty acid amides, or swellable plastics such as PVC.

The total amount of fillers present in the compositions of the present invention will preferably be up to 25 wt. %, especially to 10 wt. %, and for example from 0.1 to 5 wt. % or from 0.1 to 2 wt. % based on the total weight of the composition. The desired viscosity of the curable composition will typically be determinative of the total amount of filler added and it is submitted that in order to be readily extrudable out of a suitable dispensing apparatus—such as a tube—or readily printable the curable compositions should possess a viscosity of from 100 to 50000, from 100 to 25000 mPas, or even from 100 to 20000 mPas measured at printing temperature, preferably at room temperature.

Examples of suitable pigments are titanium dioxide, iron oxides, or carbon black.

In order to enhance shelf life even further, it is often advisable to further stabilize the compositions of the present invention with respect to moisture penetration through using drying agents. A need also occasionally exists to lower the viscosity of the composition according to the present invention for specific applications, by using reactive diluent(s). The total amount of reactive diluents present will typically be up to 15 wt. %, and preferably from 1 and 5 wt. %, based on the total weight of the composition.

The photocurable composition should comprise less than 5 wt. % of water, based on the weight of the composition, and is most preferably an anhydrous composition that is essentially free of water. These embodiments do not preclude the composition from either comprising organic solvent or being essentially free of organic solvent.

The presence of solvents and/or non-reactive diluents in the compositions of the present invention is not precluded where this can usefully moderate the viscosities thereof. For instance, but for illustration only, the compositions may contain one or more of: xylene; 2-methoxyethanol; dimethoxyethanol; 2-ethoxyethanol; 2-propoxyethanol; 2-isopropoxyethanol; 2-butoxyethanol; 2-phenoxyethanol; 2-benzyloxyethanol; benzyl alcohol; ethylene glycol; ethylene glycol dimethyl ether; ethylene glycol diethyl ether; ethylene glycol dibutyl ether; ethylene glycol diphenyl ether; diethylene glycol; diethylene glycol-monomethyl ether; diethylene glycol-monoethyl ether; diethylene glycol-mono-n-butyl ether; diethylene glycol dimethyl ether; diethylene glycol diethyl ether; diethylene glycoldi-n-butylyl ether; propylene glycol butyl ether; propylene glycol phenyl ether; dipropylene glycol; dipropylene glycol monomethyl ether; dipropylene glycol dimethyl ether; dipropylene glycoldi-n-butyl ether; N-methylpyrrolidone; diphenylmethane; diisopropylnaphthalene; petroleum fractions, such as Solvesso® products (available from Exxon); alkylphenols, such as tert-butylphenol, nonylphenol, dodecylphenol and 8,11,14-pentadecatrienylphenol; styrenated phenol; bisphenols; aromatic hydrocarbon resins especially those containing phenol groups, such as ethoxylated or propoxylated phenols; adipates; sebacates; phthalates; benzoates; organic phosphoric or sulfonic acid esters; and sulfonamides.

The above aside, it is preferred that the photocurable composition comprises less than 10 wt. %, in particular less than 5 wt. % or less than 2 wt. %, of the total of solvents and non-reactive diluents based on the total weight of the composition.

Without intention to limit the present invention, good results have been obtained where the photo-curable composition for use in additive manufacturing comprises, based on the weight of the composition:
 from 5 to 20 wt. % of a1) one or more (meth) acrylate functionalized oligomers selected from the group consisting of epoxy (meth)acrylates, urethane (meth)acrylates, polyester (meth)acrylates and polyether (meth) acrylates;
 from 20 to 80 wt. % of a2) one or more (meth)acrylate monomers, said monomers being selected from the group consisting of monofunctional (meth)acrylate monomers and difunctional (meth)acrylate monomers;
 from 0.1 to 10 wt. % of b) photoinitiator; and,
 from 0.01 to 2 wt. %, for example, 0.01 to 1.5 wt. %, from 0.01 to 1 wt. %, from 0.02 to 0.5 wt. %, or from 0.02 to 0.08 wt. % of c) said carbon nanostructures.

For example, a particularly effective photo-curable composition for use in additive manufacturing comprises, based on the weight of the composition:
 from 5 to 15 wt. % of a1) one or more (meth) acrylate functionalized oligomers selected from the group consisting of epoxy (meth)acrylates, urethane (meth)acrylates, polyester (meth)acrylates and polyether (meth) acrylates;
 from 40 to 80 wt. % of a2) one or more (meth)acrylate monomers, said monomers being selected from the group consisting of monofunctional (meth)acrylate monomers and difunctional (meth)acrylate monomers;
 from 0.1 to 5 wt. % of c) photoinitiator; and,
 from 0.01 to 2 wt. %, for example, 0.01 to 1.5 wt. %, from 0.01 to 1 wt. %, from 0.02 to 0.5 wt. %, or from 0.02 to 0.08 wt. % of c) said carbon nanostructures.

Preparation and Use of the Compositions

To form a composition, the above described parts are brought together and mixed. As is known in the art, to form one component (1K) curable compositions, the elements of the composition are brought together and homogeneously mixed under conditions which inhibit or prevent the reactive components from reacting: as would be readily comprehended by the skilled artisan, this might include mixing conditions which limit or prevent exposure to irradiation. As such, it will often be preferred that the curative elements are not mixed by hand but are instead mixed by machine—a static or dynamic mixer, for example—in pre-determined amounts under anhydrous conditions without intentional photo-irradiation.

For the two component (2K) compositions, the reactive components are brought together and mixed in such a manner as to induce the hardening thereof. For both one (1K) and two (2K) component compositions, the reactive compounds should be mixed under sufficient shear forces to yield a homogeneous mixture. It is considered that this can be achieved without special conditions or special equipment. That said, suitable mixing devices might include: static mixing devices; magnetic stir bar apparatuses; wire whisk devices; augers; batch mixers; planetary mixers; C. W. Brabender or Banbury® style mixers; and, high shear mixers, such as blade-style blenders and rotary impellers.

For small-scale liner applications in which volumes of less than 2 liters will generally be used, the most typical packaging for the two component (2K) compositions will be side-by-side double cartridges or coaxial cartridges, in which two tubular chambers are arranged alongside one another or inside one another and are sealed with pistons: the driving of these pistons allows the components to be extruded from the cartridge, advantageously through a closely mounted static or dynamic mixer. For larger volume applications, the two components of the composition may advantageously be stored in drums or pails: in this case the two components are extruded via hydraulic presses, in particular by way of follower plates, and are supplied via pipelines to a mixing apparatus which can ensure fine and highly homogeneous mixing of the hardener and binder components. In any event, for any package it is important that the binder component be disposed with an airtight and moisture-tight seal, so that both components can be stored for a long time, ideally for 12 months or longer.

Non-limiting examples of two component dispensing apparatuses and methods that may be suitable for the present invention include those described in U.S. Pat. Nos. 6,129,244 and 8,313,006.

Where applicable, two (2K) component compositions should broadly be formulated to exhibit an initial viscosity—determined immediately after mixing, for example, up to two minutes after mixing—of less than 50000 mPa·s, for instance less than 25000 mPa·s, at 25° C. Independently of or additional to said viscosity characteristics, the two (2K) component composition should be formulated to be bubble (foam) free upon mixing and subsequent curing. Moreover, the two component (2K) composition should further be formulated to demonstrate at least one, desirably at least two and most desirably all of the following properties: i) a long pot life, typically of at least 30 minutes and commonly of at least 60 or 120 minutes, which pot life should be understood herein to be the time after which the viscosity of a mixture at 20° C. will have risen to more than 50,000 mPas; ii) a maximum exotherm temperature of no greater than 120° C., preferably no greater than 100° C. and more preferably no greater than 80° C.; and, iii) a Shore A hardness of at least 50, preferably at 60 and more preferably at least 70 after being cured and stored for 7 days at room temperature and 50% relative humidity.

Methods and Applications

In accordance with the broadest process aspects of the present invention, the above described compositions are applied to a substrate and then cured in situ. Prior to applying the compositions, it is often advisable to pre-treat the relevant surfaces to remove foreign matter there from: this step can, if applicable, facilitate the subsequent adhesion of the compositions thereto. Such treatments are known in the art and can be performed in a single or multi-stage manner constituted by, for instance, the use of one or more of: an etching treatment with an acid suitable for the substrate and optionally an oxidizing agent; sonication; plasma treatment, including chemical plasma treatment, corona treatment, atmospheric plasma treatment and flame plasma treatment; immersion in a waterborne alkaline degreasing bath; treatment with a waterborne cleaning emulsion; treatment with a cleaning solvent, such as carbon tetrachloride or trichloroethylene; and, water rinsing, preferably with deionized or demineralized water. In those instances where a waterborne alkaline degreasing bath is used, any of the degreasing agent remaining on the surface should desirably be removed by rinsing the substrate surface with deionized or demineralized water.

In some embodiments, the adhesion of the coating compositions of the present invention to the preferably pretreated substrate may be facilitated by the application of a primer thereto. Whilst the skilled artisan will be able to select an appropriate primer, instructive references for the choice of primer include but are not limited to: U.S. Pat. Nos. 3,671,483; 4,681,636; 4,749,741; 4,147,685; and, U.S. Pat. No. 6,231,990.

The compositions are then applied to the preferably pre-treated, optionally primed surfaces of the substrate. And, as noted above, in a specific embodiment of the present invention, this application is effected by additive manufacturing methods.

Most broadly, two techniques are known for additive manufacturing are known and may be utilized in the present invention: a first in which new layers are formed at the top surface of the growing object; a second method in which new layers are formed at the bottom surface of the growing object. The teaching of the following documents may be instructive in the regard: U.S. Pat. No. 5,236,637 (Hull); U.S. Pat. Nos. 7,438,846; 7,892,474; US 2013/0292862 A1 (Joyce); US 2013/0295212 A1 (Chen et al.); and Pan et al., J. Manufacturing Sci. and Eng. 134, 051011-1 (October 2012).

In a typical mode of application, the method of the present invention comprises the step of printing the above defined composition with a 3D printer, irradiating the composition so that it at least partially cures thereon to form a coating layer on the substrate. The resultant layer formed by 3D printing is desirably both continuous and of consistent thickness.

In an important embodiment, the present method incorporates the steps of: i) providing a carrier and an optically transparent member having a movable build surface, said carrier and build surface defining a build region there between; ii) within said build region, applying by 3D printing a first layer of the composition as defined herein above and in the appended claims; iii) irradiating said build region through said optically transparent member to at least partially cure that first layer; iv) applying a subsequent layer of said composition as defined herein above and in the appended claims by 3D printing on the at least partially cured layer; and, v) irradiating said build region through said optically transparent member to at least partially cure that subsequent layer. In an iterative process, steps iii) and iv) may be performed and repeated so as to dispose second, third, fourth and further layers on the substrate.

As used herein, the term "at least partially cured" means that curing of the curable composition has been initiated and that, for example, cross-linking of components of the composition has commenced. The term encompasses any amount of cure upon application of the curing condition, from the formation of a single cross-link to a fully cross-linked state. Obviously, the rate and mechanism with which the composition cures is contingent on various factors, including the components thereof, functional groups of the components and the parameters of the curing condition.

At least partial solidification of a given coating layer is generally indicative of cure or drying. However, both drying and cure may be indicated in other ways including, for instance, a viscosity change of the coating layer, an increased temperature of that coating layer and/or a transparency/opacity change of that coating layer. It may be desirable for the or each step iii) of the above described application process to be commenced only when the at least partially cured or partially dried preceding layer can substantially retain its shape upon exposure to ambient conditions. By "substantially retains its shape" it is meant that at least 50% by volume, and more usually at least 80% or 90% by volume of the at least partially cured or dried layer retains its shape and does not flow or deform upon exposure to ambient conditions for a period of 5 minutes. Under such circumstances, gravity should not therefore substantially impact the shape of the at least partially cured or partially dried layer upon exposure to ambient conditions.

For completeness, the shape of the at least partially dried or at least partially cured layer will impact whether said layer substantially retains its shape. For example, when said layer is rectangular or has another simplistic shape, the at least partially cured or dried layer may be more resistant to deformation at even lesser levels of cure or even lesser degrees of drying than layers having more complex shapes.

In certain embodiments, the 3D-printing of the subsequent layer (step iii)) occurs before an at least partially cured layer has reached a final cured state, nominatively while the layer is still "green." In such embodiments, printing of the layers may be considered "wet-on-wet" such that the adjacent layers at least physically bond, and may also chemically bond, to one another. For example, it is possible that components in each of the first and subsequent layers can chemically cross-link/cure across the print line, which effect can be beneficial to the longevity, durability and appearance of the 3D article. Importantly, the distinction between partial cure and a final cured state is whether the partially cured layer can undergo further curing or cross-linking. This does not actually preclude functional groups being present in the final cure state but such groups may remain un-reacted due to steric hindrance or other factors.

In the aforementioned iterative process, the thickness, width, shape and continuity of each layer may be independently selected such that the or each preceding and subsequent layer may be the same or different from one another in one or more of these regards. For example, a given subsequent layer may only contact a portion of an exposed surface of the at least partially cured or dried preceding layer: depending on the desired shape of the coating layer, the subsequent layer may build on that layer selectively.

The thickness and/or width tolerances of the or each layer may depend on the 3D printing process used, with certain printing processes having high resolutions and others having low resolutions. Whilst the present disclosure is not limited to any particular dimensions of any of the layers, it is recommended that the compositions be applied to a wet film thickness of from 10 to 5000 μm or from 10 to 1000 μm. The application of thinner layers within this range is more economical but great control must be exercised in applying thinner layers to avoid the formation of discontinuous cured or dried films.

There is no particular intention to limit the types of 3D printers and/or 3D printing methodologies which may be utilized in the present invention. For instance, a suitable 3D printer may be selected from: stereolithography printers; continuous liquid interface production printers, digital light synthesis printers; material jet printers; polyjet printers; ink-jetting printers; material jetting printers; and, syringe extrusion printer. It is further noted that the 3D printer may be independently selected during each printing step of an iterative process when employed in the present method:

thus, if desired, each printing step of an iterative process may utilize a different 3D printer such that different characteristics are imparted with respect to distinct layers.

For solvent borne compositions which yield a film upon drying, any required drying step can of course be accelerated by the application of an elevated temperature, for instance a temperature in the range of from 50° C. to 150° C. or from 50° C. to 120° C. Conduction, convection and/or induction heating methods may be employed in this context. The use of forced air in conjunction with heating may be beneficial to the drying process in certain circumstances.

As will be recognized by the skilled artisan, any requisite step or, in an iterative process, each drying step for a solvent borne composition need not be performed in a single, continuous manner. It can be advantageous, for example, to apply heat in a first stage up until the onset of coating coalescence and while the coating composition remains fluid-like: in such a state, the coating may hold fillers, including microspheres in place, but will also flow sufficiently to enable it to become leveled on the substrate. Heat may then subsequently be applied again to a temperature sufficient to further drive the solvent off from the composition.

Conventionally, the energy source used to cure the radiation curable compositions will emit at least one of ultraviolet (UV) radiation, infrared (IR) radiation, visible light, X-rays, gamma rays, or electron beams (e-beam). Subsequent to their application by 3D-printing, the radiation curable coating compositions may typically be activated in less than 5 minutes, and commonly between 1 and 60 seconds—for instance between 3 and 12 seconds—when irradiated using commercial curing equipment.

Irradiating ultraviolet light should typically have a wavelength of from 150 to 600 nm and preferably a wavelength of from 200 to 450 nm. Useful sources of UV light include, for instance, extra high pressure mercury lamps, high pressure mercury lamps, medium pressure mercury lamps, low intensity fluorescent lamps, metal halide lamps, microwave powered lamps, xenon lamps, UV-LED lamps and laser beam sources such as excimer lasers and argon-ion lasers.

Where an e-beam is utilized to cure the layer(s), standard parameters for the operating device may be: an accelerating voltage of from 0.1 to 100 keV; a vacuum of from 10 to $10^{-3}$ Pa; an electron current of from 0.0001 to 1 ampere; and, power of from 0.1 watt to 1 kilowatt.

The amount of radiation necessary to cure an individual, radiation curable composition will depend on a variety of factors including the angle of exposure to the radiation and the thickness of a coating layer. Broadly however, a curing dosage of from 5 to 5000 mJ/cm$^2$ may be cited as being typical: curing dosages of from 50 to 500 mJ/cm$^2$, such as from 50 to 400 mJ/cm$^2$ may be considered highly effective.

The curing of the so-printed curable compositions should typically occur at temperatures in the range of from −10° C. to 120° C., preferably from 0° C. to 70° C., and in particular from 20° C. to 60° C. The temperature that is suitable depends on the specific compounds present and the desired curing rate and can be determined in the individual case by the skilled artisan, using simple preliminary tests if necessary. Of course, curing at temperatures of from 10° C. to 35° C. or from 20° C. to 30° C. are especially advantageous as they obviate the requirement to substantially heat or cool the mixture from the usually prevailing ambient temperature. Where applicable, however, the temperature of the curable compositions may be raised above the mixing temperature and/or the application temperature using conventional means, including microwave induction.

The use of CNS as provided herein enables the use of additive manufacturing techniques to produce printed workpieces having a volume resistivity no greater than $10^5$ ohm·cm, for example, no greater than $10^4$ ohm·cm, no greater than $5 \times 10^3$ ohm·cm, no greater than $10^3$ ohm·cm, or no greater than $5 \times 10^2$ ohm·cm.

The following examples are illustrative of the present invention and are not intended to limit the scope of the invention in any way.

EXAMPLES

Conductivity Test

By voltmeter: Rectangular sample bars were cut out from UV cured round discs. Prior to the conductivity test, a layer of silver paint was applied to both ends of sample bars and dried for 20 min at 23° C. The sample bar was clamped between two brass electrodes which were 43 mm (L) apart. The electrical resistance (ohm) was measured between the painted electrodes according to ASTM D257-07 using a voltmeter-ammeter able to measure volume resistance (Rv) up to about $10^6$-$10^7$ ohm or volume resistivity up to about $10^6$-$10^7$ ohm·cm (177 True RMS Multimeter, Fluke Corporation). Volume resistivity was calculated using the following equation:

$$\rho_v = (R_v \times A)/L (\text{ohm·cm}), \text{ where } A = W \times t (\text{cm}^2).$$

With Keithley 8009 test fixture: A Keithley 6517A resistance meter with a Keithley 8009 resistivity test fixture was used to measure volume resistance $R_v$ exceeding $10^6$ ohm or volume resistivity exceeding $10^6$ ohm·cm on UV cured round discs according to ASTM D257-07. The alternating voltage was set to 10 V. The average result from 8 tests per specimen was recorded and volume resistivity calculated using the equation above.

A Keithley 2410-C SourceMeter equipped with either a 2-point probe fixture or a Keithley 8009 resistivity test fixture was used for surface resistivity measurement of UV cured round discs. The result for each sample was the average of a single measurements each of 5 locations (i.e., five measurements in total).

Dispersibility Test

A droplet-sized amount of CNS dispersion was pressed between two microscope slides by hand. An image was collected with an Olympus BX51 light microscope at 100× and had dimensions of approximately 670 microns×880 microns. Where necessary, the width of carbon nanostructure fragments was measured by hand or using image analysis software (Stream Essentials, OLYMPUS CORPORATION). Dispersion was acceptable when no more than one fragment of a carbon nanostructure having a bundle width greater than 50 microns was observed.

UV Curing of Resin Formulations

Each resin formulation was poured into an aluminum weighing boat with a diameter of about 7.5 cm (60 mL aluminum weighing dish, Fisher Scientific). The dispersion was allowed to self-level before UV curing. A UVP Crosslinker CL-1000L equipped with 365 nm wavelength UV lamp was used as the UV source. Curing was performed using the Preset UV Energy Exposure mode, in which a desired dose of UV radiation, as indicated in certain examples below, was delivered. The corresponding exposure time (same as curing time) was also recorded. After UV curing, the film that formed on top of the formulation was removed and cleaned with tissue paper to remove uncured liquid. The underside of the film was further cured with 0.2 J/cm$^2$ 365 nm radiation from the same source and then cleaned with acetone wipes. For each resin formulation, the film thickness was plotted versus curing time. The curing speed (μm/second) for each resin formulation was calculated based on the slope of a line fit to the data by linear regression using Microsoft Excel.

Working Curve Equation

Figure 4:
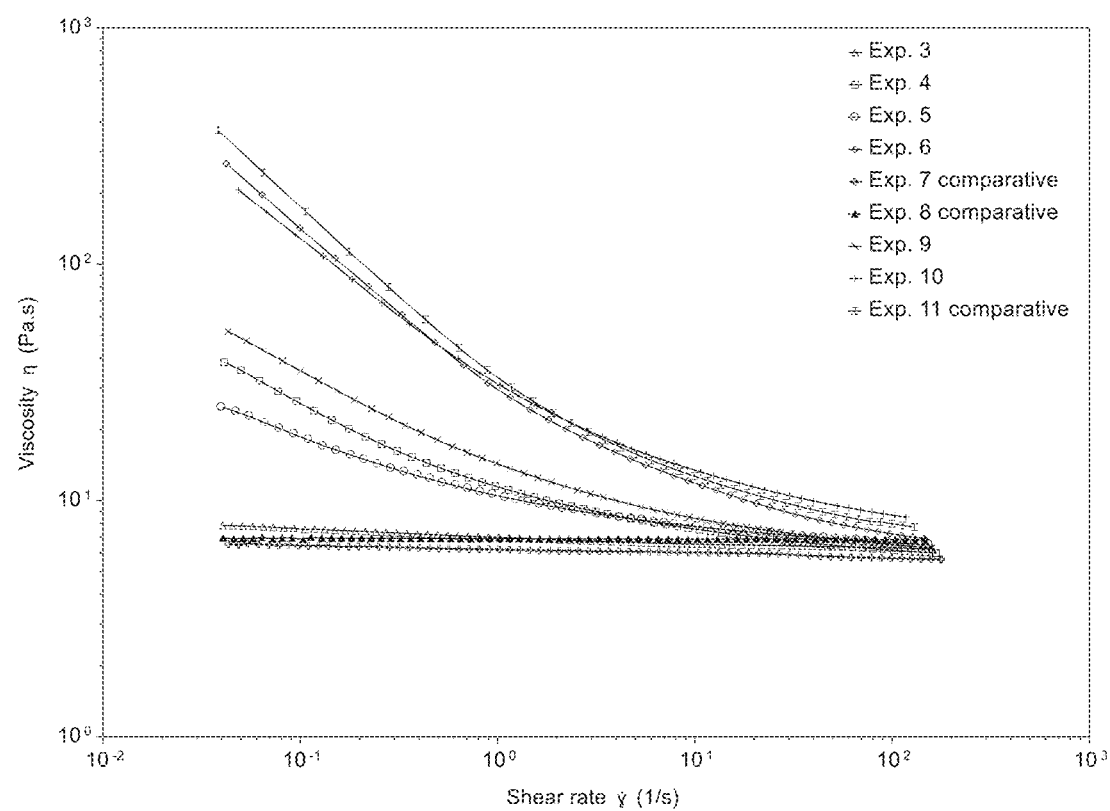
FIG. 4 is a plot of the viscosity of resin formulations produced according to Examples 3-11.

The curing behavior of CNS dispersions was analyzed based on Jacobs' basic working curve equation (Jacobs P F. Fundamentals of stereolithography. *Proceedings of Solid Free Form Symposium.* 1992:196-211):

$$C_d = D_p \ln\left[\frac{E_0}{E_c}\right]$$

where Cd is the thickness of cured resin film, Dp is the depth at which the penetrating light intensity reduces to 1/e of the surface intensity, $E_0$ is the energy of light at the surface, and Ec is the critical energy required to initiate polymerization. To determine Dp and Ec for a CNS dispersion, several UV cured films were made with various preset energy exposures. Linear regression of the semilog plot of Cd (film thickness) vs. $\ln(E_0)$ (energy exposure) can be used to calculate a slope of Dp and an x-intercept of Ec, as shown in FIG. 4.

Rheology Properties

Rheology properties were measured using an AR2000ex rheometer (TA Instruments) using 40 mm stainless steel parallel plates and a sample gap of 500 μm at 25° C. Samples were conditioned between the two plates, set at the gap distance, for 10 min prior to measurement. The viscosity profile was measured using a stepped flow mode, with stress ramped from 1.0E-7 MPa to 1.0E-3 MPa.

Example 1 (Comparative)

A Loctite PR10 digital light processing printer (Henkel AG & Co. KgaA) was used according to the manufacturer's instructions to print circular discs (diameter 3 inches, thickness 2-3 mm) with Loctite 3D 3840 grey photocurable acrylic resin (Henkel AG & Co. KgaA). The surface and volume resistivity of the test pieces was determined using ASTM D-257. Results are shown in Table 3.

Example 2

PEG-coated carbon nanostructure particles (Applied Nanostructured Solutions LLC) were dispersed in Loctite 3D 3840 Gray resin to a loading of 0.05 wt. %, based on the total weight of the composition. To achieve a homogeneous dispersion, the CNS-resin mixture was homogenized in Misonix Sonicator® 3000 Ultrasonic Liquid sonicator at 100% amplitude. The sonication dispersing process was performed to have 10 second pulse sonication with a 5 second pausing to avoid overheating. The total sonication time was 20 min, with a total of 120 pulses. The obtained composition was provided to the Loctite PR10 (DLP) printer and circular discs (diameter 3 inches, thickness 2-3 mm) were successfully printed using the parameters listed in Table 1 (initial layers: to bond workpiece to build platform; default layers: to form workpiece; TAT: time at top=dwell time to allow raw material to flow under previous cured layer; rehab time: dwell time to allow resin to level; retraction speed up/down: speed that the build platform moves away (up) and towards (down) to the reservoir of raw material; retraction height: distance required to release a printed layer from the reservoir of uncured material; intensity: projector (light) intensity).

TABLE 1

| Print settings | |
| --- | --- |
| Two Initial layers: Thickness, 100 micron | |
| Cure time (s) | 90 |
| TAT (s) | 10 |
| Rehab time (s) | 20 |
| Retraction speed up (mm/s) | 50 |
| Retraction speed down (mm/s) | 100 |
| Retraction height (mm) | 7 |
| Intensity (%) | 100 |
| Default layers: Thickness, 50 micron | |
| Cure time (s) | 9 |
| TAT (s) | 10 |
| Rehab time (s) | 20 |
| Retraction speed up (mm/s) | 50 |
| Retraction speed down (mm/s) | 100 |
| Retraction height (mm) | 7 |
| Intensity (%) | 100 |

The surface and volume resistivity of the test pieces was determined using ASTM D-257-07. The results of this testing are listed in Table 3 and demonstrate that the addition of the carbon nanostructures to the resin imparted the printed parts with anti-static properties.

Examples 3-6

Examples 3-6 describe a direct mixing approach to prepare photocurable compositions containing 0.05% CNS. First, a mixture of Sartomer SR494 alkoxylated pentaerythritol tetraacrylate and Sartomer CN964 polyurethane acrylate resins (Arkema) (1:1 ratio by weight) was mixed in a MAX 200 mixing cup (FlackTek, Inc.) at 2000 rpm on a Speedmixer DAC 600.2 VAC (FlackTek) for total of 24 minutes, with the cup cooled in an ice/water bath for five minutes after every three minutes of mixing. Then, 20-25 g of the resin mixture and an appropriate amount of PEG-coated CNS to prepare a 0.05 wt % mixture were mixed in a MAX 100 cup (FlackTek, Inc.) in the Speedmixer at 2000 rpm. Mixing times and grinding media (ten 10 mm cylindrical grinding media (part number 501 400 from FlackTek) were varied as set forth in Table 3. For Examples 3 and 4, the mixture was stirred in the Speedmixer for 3 min without cooling. For Example 5, after 4 min of mixing, the mixture was cooled with ice water for 5 min, followed by 3 min mixing, and finally cooled in ice water for 5 min. For Example 4, the mixture was cooled in ice water for 5 min after each 2 min of mixing, and finally cooled in ice water for 5 minutes. The grinding media was removed and Genocure TPO-L photoinitiator (Rahn) was incorporated at a weight ratio of 1% based on the total weight of the mixture at 2000 rpm for 1 min without grinding media. The viscosity of the samples prior to addition of initiator is shown in FIG. 4.

Figure 5:
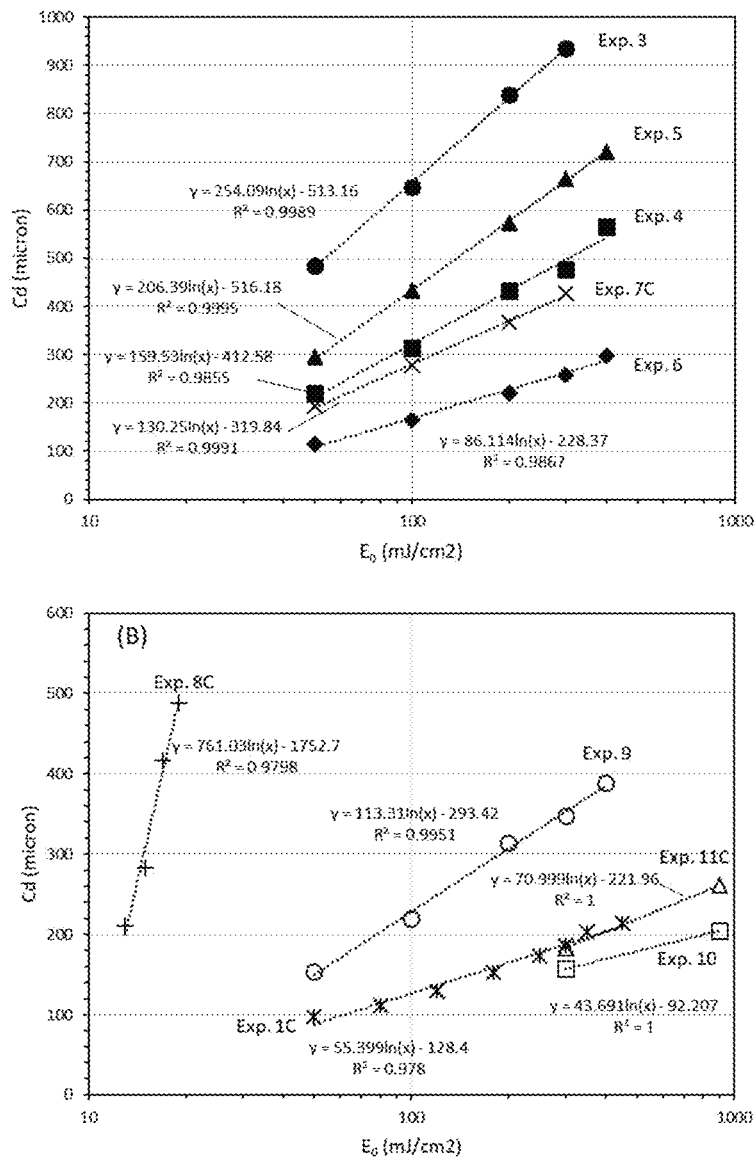
FIG. 5 is a series of plots of curing depth with respect to curing energy for resin formulations according to the Examples 1 and 3-11.

To evaluate the UV curing behavior of this formulation, several UV cured films were made using a UVP Crosslinker Model CL-1000L 365 nm UV irradiation system available from Analytik Jena US using preset UV energies from 0.05 to 0.4 mJ/cm² as noted in Table 3. The thickness of the resulting films was measured and used to calculate curing speed, Dp, and Ec (FIG. 5). Surface and volumetric resistivity tests were conducted on the samples that experienced a total UV radiation dose of 0.3 J/cm² (Table 3).

Example 7 Comparative

Comparative Example 7 describes a direct mixing approach to prepare a photocurable composition containing 0.05% VULCAN® XC72R carbon black (Cabot Corporation). Resin dispersions and UV cured films were prepared with the same composition as in Example 6, except that carbon black was substituted for CNS. The mixing time and conditions are set forth in Table 3. The following compounds and apparatus were employed in Example 7. Viscosity of the uncured material is shown in FIG. 4. A series of UV cured films were prepared as in Example 6 to calculate curing speed, Dp, and Ec (FIG. 5). Surface and volumetric resistivity tests were conducted on a sample that experienced a total UV radiation dose of 0.3 J/cm$^2$ (Table 3).

Example 8 Comparative

Example 8 describes the mixing of SR494 and CN964 resins at a 1:1 weight ratio. The two resins were charged into a MAX 200 cup (DAC 600.2 VAC, Flacktek, Inc) and mixed on a Speedmixer DAC 600.2 VAC at 2000 rpm for a total mixing time of 24 min without grinding media. After every 3 min of mixing, the mixture was cooled in an ice/water bath for 5 min. Genocure TPO-L photoinitiator (Rahn) was incorporated at a weight ratio of 1% based on the total weight of the mixture at 2000 rpm for 1 min without grinding media. The viscosity of the formulation is shown in FIG. 4. A series of UV cured films were prepared as described in Example 6 with UV energies in the range from 0.013 to 0.04 mJ/cm$^2$ to calculate curing speed, Dp, and Ec (FIG. 5). Surface and volumetric resistivity tests were conducted on a sample that experienced a total UV radiation dose of 0.04 mJ/cm$^2$ (Table 3).

Examples 9-10

Figure 6:
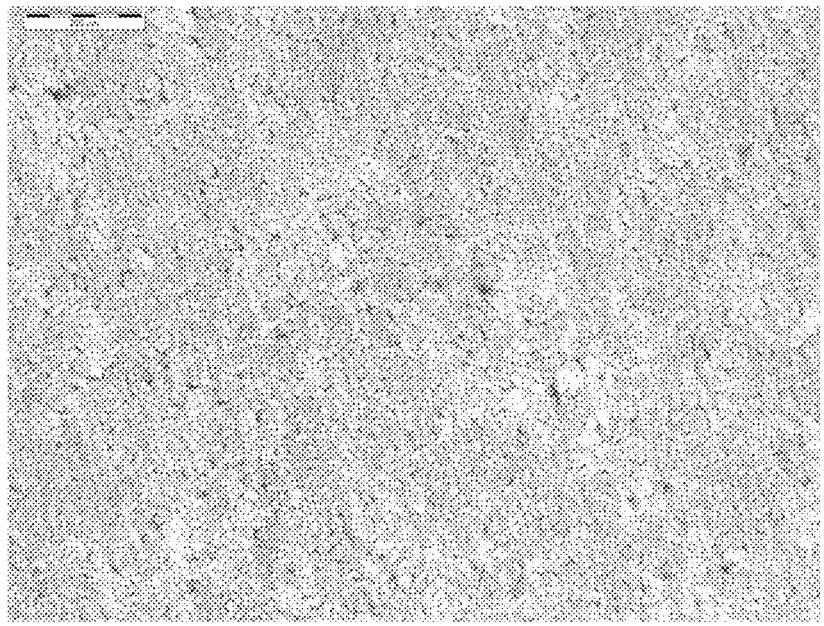
FIG. 6 is an optical micrograph of a photocurable resin concentrate formulation containing 1% CNS.

Examples 9-10 describe a CNS concentrate (1% CNS in resin) approach to prepare a photocurable composition containing 0% (comparative), 0.05% and 0.1% CNS. One part (w/w) CNS pellets was initially wetted in 49.5 parts Sartomer SR494 resin in a MAX 100 regular mixing cup using the Speedmixer DAC 600.2 VAC at 2000 rpm for a total mixing time of 3 min with ten 10 mm cylindrical grinding media (part number 501 400 from FlackTek Inc.) to form a paste-like dispersion. After each minute of mixing, the cup was cooled in an ice/water bath for five min. The resulting mixture was further mixed with 49.5 parts Sartomer CN964 resin at 2000 rpm with ten grinding media for five one minute intervals. The mixing cup was cooled in an ice water bath for five minutes following each mixing cycle. The level of dispersion of the CNS in the concentrate was evaluated with an optical microscope as described above. FIG. 6 shows that the CNS formed a fully dispersed network in the UV curable resin.

Figure 7:
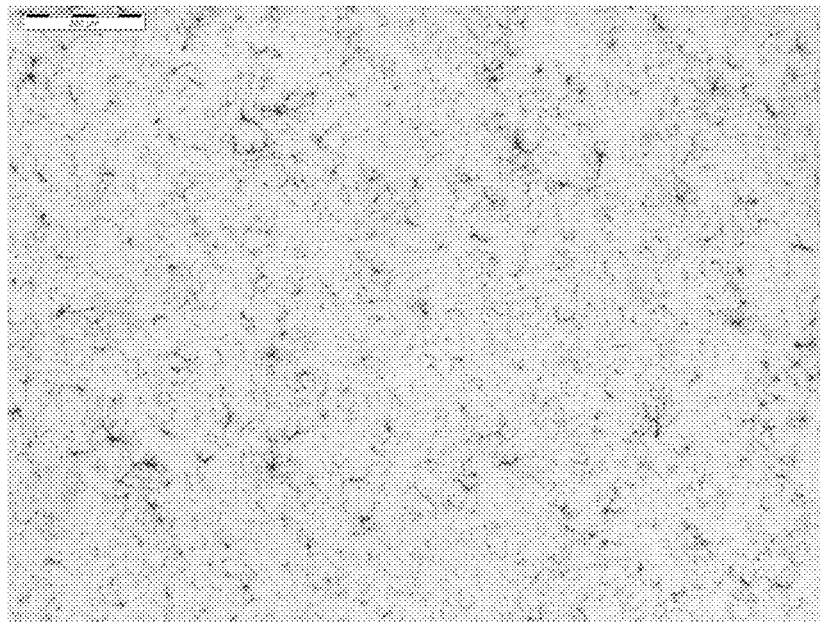
FIG. 7 is an optical micrograph of a photocurable resin letdown formulation containing 0.05% CNS.

The CNS concentrate was then dispersed to a target loading in a UV curable formulation according to Table 2. A 1:1 (w/w) mixture of Sartomer SR494 and CN964 resins (without photoinitiator) was prepared as described in Example 8. The appropriate amount of 1% CNS concentrate was mixed with the SR494/CN964 resin mixture in a Flacktek speedmixer at 2000 rpm for a total of 3 min without grinding media, with the sample cooled in ice water for five minutes after each 1.5 min of mixing. 1% Genocure TPO-L photoinitiator was added and mixed using the Speedmixer at 2000 rpm without grinding media for one minute. The viscosity of the formulations prior to addition of the photoinitiatoris shown in FIG. 4. FIG. 7 shows that the CNS formed a fully dispersed network in the UV curable resin.

To evaluate the UV curing behavior of this formulation, several UV cured films were made using UVP Crosslinker (model CL-1000L) with preset UV energies from 0.05 to 0.4 mJ/cm$^2$ (FIG. 5). The thickness of the resulting films were measured and used to calculate curing speed, Dp, and Ec. Surface and volumetric resistivity tests were conducted on samples that experienced a total UV radiation dose of 0.3 J/cm$^2$ (Table 4).

TABLE 2

| | Examples: | | |
|---|---|---|---|
| Component | 8 (comparative) wt % | 9 wt % | 10 wt % |
| 1% CNS concentrate | 0 | 5 | 10 |
| SR494/CN964, 1:1 (w/w) mixture | 99 | 94 | 89 |
| TPO-L | 1 | 1 | 1 |
| Total | 100 | 100 | 100 |

Example 11 (Comparative)

Comparative Example 11 describes a SWCNT (TUBALL carbon nanotubes from OCSiAl) concentrate (1% CNT in resin) approach to prepare a photocurable composition containing 0.1% SWCNT using the method described for Examples 9 and 10, except SWCNT was used rather than CNS and final concentration of SWCNT was 0.1%. The viscosity of the formulation prior to addition of the photoinitiator is shown in FIG. 4.

To evaluate the UV curing behavior of this formulation, several UV cured films were made using a UVP Crosslinker (Model CL-1000L) with preset UV energies from 0.05 to 0.4 mJ/cm$^2$. The thickness of the resulting films were measured and used to calculate curing speed, Dp, and Ec (FIG. 5). Surface and volumetric resistivity tests were conducted on a sample that experienced a total UV radiation dose of 0.3 J/cm$^2$ (Table 4).

TABLE 3

| Examples | 1* | 2 | 3 | 4 | 5 | 6 | 7* |
|---|---|---|---|---|---|---|---|
| Filler | CNS | CNS | CNS | CNS | CNS | CNS | Carbon Black |
| Loading, % | 0.00 | 0.05 | 0.05 | 0.05 | 0.05 | 0.05 | 0.05 |
| Resin | Loctite 3840 Grey | Loctite 3840 Grey | SR494/ CN964 | SR494/ CN964 | SR494/ CN964 | SR494/ CN964 | SR494/ CN964 |
| Mixing equipment/ time (min) | — | Ultrasonic/20 | Speedmixer/3 | Speedmixer/3 | Speedmixer/7 | Speedmixer/7 | Speedmixer/7 |
| Grinding media | — | No | No | Yes | No | Yes | Yes |
| Sample thickness | 3.27 ± 0.11 | 3.20 ± 0.15 | 0.935 ± 0.103 | 0.476 ± 0.026 | 0.666 ± 0.084 | 0.258 ± 0.017 | 0.426 ± 0.042 |

TABLE 3-continued

| Examples | 1* | 2 | 3 | 4 | 5 | 6 | 7* |
|---|---|---|---|---|---|---|---|
| for resistivity measurement (mm) | | | | | | | |
| Exposed UV energy (J/cm$^2$) | — | — | 0.3 | 0.3 | 0.3 | 0.3 | 0.3 |
| VR, ohm · cm, with Keithley 8009 fixture | 2.61E+14 | 3.25E+10 | 3.32E+07 | — | — | — | 5.06E+13 |
| VR, ohm · cm, by Voltmeter | — | — | 5.54E+06 | 1.63E+03 | 5.01E+03 | 4.50E+02 | — |
| SR, ohm/sq, with Keithley 8009 fixture | 1.24E+15 | 6.25E+09 | 2.47E+08 | — | — | — | 4.01E+15 |
| SR, ohm/sq, with 2-probe fixture | — | — | 2.06E+07 | 2.22E+05 | 2.26E+06 | 8.98E+04 | — |
| Dp curing depth (μm) | 55.4 | — | 254.1 | 159.5 | 206.4 | 86.1 | 130.3 |
| Curing speed (μm/sec) | 1.6 | — | 8.0 | 4.6 | 5.7 | 2.5 | 3.8 |
| Ec (mJ/cm$^2$) | 10.2 | — | 7.5 | 13.3 | 12.2 | 14.2 | 13.3 |

*Comparative Example

TABLE 4

| Examples | 8* | 9 | 10 | 11* |
|---|---|---|---|---|
| Filler | CNS | CNS | CNS | CNS |
| Loading, % | 0 | 0.05 | 0.1 | 0.1 |
| Resin | SR494 CN964 | SR494 CN964 | SR494 CN964 | SR494 CN964 |
| Mixing equipment | Speedmixer | Speedmixer | Speedmixer | Speedmixer |
| Sample thickness (Cured with 0.3 mJ/cm$^2$ energy exposure) (mm) | 0.838 ± 0.007 | 0.347 ± 0.019 | 0.157 ± 0.002 | 0.183 ± 0.003 |
| Exposed UV energy (J/cm$^2$) | 0.04 | 0.3 | 0.3 | 0.3 |
| VR, ohm · cm, with Keithley 8009 fixture | 6.24E+14 | — | 2.62E+06 | 2.70+E06 |
| VR, ohm · cm, by Voltmeter | — | 1.94E+03 | 2.71E+02 | 1.52E+03 |
| SR, ohm/sq, with Keithley 8009 fixture | — | — | — | — |
| SR, ohm/sq, by 2-probe | — | 3.26E+05 | 7.56E+04 | 1.36E+05 |
| Dp curing depth (μm) | 761.0 | 113.3 | 43.7 | 71.0 |
| Curing speed (μm/sec) | 103.0 | 3.1 | 1.7 | 2.7 |
| Ec (mJ/cm$^2$) | 10.0 | 13.3 | 8.3 | 22.8 |

*Comparative Example

In view of the foregoing descriptions and examples, it will be apparent to those skilled in the art that equivalent modifications thereof can be made without departing from the scope of the claims.

What is claimed is:

1. A photo-curable composition for use in additive manufacturing, said composition comprising:
   a) at least one photocurable monomer or oligomer;
   b) a photoinitiator for polymerization of the monomer or oligomer; and,
   from 0.01 to 2 wt. %, based on the weight of the composition, of c) at least one CNS-derived material selected from the group consisting of: carbon nanostructures, fragments of carbon nanostructures, fractured carbon nanotubes, elongated CNS strands, dispersed CNSs, and any combination thereof, wherein, following polymerization, the resulting polymerized composition has a resistivity, as measured by CTM Method 1, no greater than 10$^5$ ohm·cm,
   the carbon nanostructures or fragments of carbon nanostructures include a plurality of multiwall carbon nanotubes that are crosslinked in a polymeric structure by being branched, interdigitated, entangled and/or sharing common walls,
   the fractured carbon nanotubes are derived from the carbon nanostructures and are branched and share common walls with one another, and
   elongated CNS strands are derived from the carbon nanostructures and include CNTs that have been displaced linearly with respect to one another, and
   the dispersed CNS comprise exfoliated fractured CNTs that do not share common walls with one another.

2. The composition according to claim 1 comprising, based on the weight of the composition, from 5 to 95 wt. % of said at least one photocurable monomer or oligomer.

3. The composition according to claim 1, wherein said component a) comprises a cationically curable monomer or oligomer, a radically curable monomer or oligomer, or a mixture thereof.

4. The composition according to claim 1, wherein said component a) is characterized by comprising:
   a1) one or more (meth) acrylate functionalized oligomers; and, a2) one or more (meth)acrylate monomers, said monomers being selected from the group consisting of monofunctional (meth)acrylate monomers and difunctional (meth)acrylate monomers.

5. The composition according to claim 4, wherein the macro-monomer component a1) comprises or consists of one or more oligomers selected from the group consisting of epoxy (meth)acrylates, urethane (meth)acrylates, polyester (meth)acrylates and polyether (meth)acrylates.

6. The composition according to claim 5, wherein the (meth)acrylate monomers a2) comprise esters of $C_1$-$C_4$ monofunctional alcohols with (meth)acrylic acid.

7. The composition according to claim 1, wherein said component a) comprises an organopolysiloxane monomer, oligomer, or mixture thereof.

8. The composition according to claim 1 comprising, based on the weight of the composition, from 0.1 to 10 wt. % of photoinitiator b).

9. The composition according to claim 1 comprising, based on the weight of the composition, from 0.01 to 1.5 wt. % of said CNS-derived material.

10. The composition according to claim 1, wherein the carbon nanostructures are coated or in a mixture with a binder.

11. The composition according to claim 10, wherein the weight of the binder relative to the weight of the coated carbon nanostructures is within the range of from about 0.1% to about 10%.

12. The composition according to claim 1, further comprising one or more additives selected from fillers, solvents, reactive diluents, corrosion inhibitors, catalysts, antioxidants, UV absorbers/light stabilizers, hydrolysis stabilizers, metal deactivators, antistatic agents, reinforcers, antifogging agents, propellants, biocides, plasticizers, lubricants, emulsifiers, dyes, pigments, rheological agents, impact modifiers, adhesion regulators, optical brighteners, flame retardants, anti-drip agents, nucleating agents, wetting agents, thickeners, protective colloids, defoamers, and tackifiers.

13. The composition according to claim 1, further comprising one or more additives selected from plasticizers, antioxidants, UV stabilizers, hydrolysis stabilizers, toughening rubbers, and fillers.

14. The photo-curable composition according to claim 1 comprising, based on the weight of the composition:
from 5 to 20 wt. % of a1) one or more (meth)acrylate functionalized oligomers selected from the group consisting of epoxy (meth)acrylates, urethane (meth)acrylates, polyester (meth)acrylates and polyether (meth)acrylates;
from 20 to 80 wt. % of a2) one or more (meth)acrylate monomers, said monomers being selected from the group consisting of monofunctional (meth)acrylate monomers and difunctional (meth)acrylate monomers;
from 0.1 to 10 wt. % of b) photoinitiator; and,
from 0.01 to 2 wt. % of c) said at least one CNS-derived material.

15. The photo-curable composition according to claim 1 comprising, based on the weight of the composition:
from 5 to 15 wt. % of a1) one or more (meth)acrylate functionalized oligomers selected from the group consisting of epoxy (meth)acrylates, urethane (meth)acrylates, polyester (meth)acrylates and polyether (meth)acrylates;
from 40 to 80 wt. % of a2) one or more (meth)acrylate monomers, said monomers being selected from the group consisting of monofunctional (meth)acrylate monomers and difunctional (meth)acrylate monomers;
from 0.1 to 5 wt. % of b) photoinitiator; and
from 0.01 to 2 wt. % of c) said at least one CNS-derived material.

16. A method for forming a three dimensional object, said method comprising:
i) providing a carrier and an optically transparent member having a movable build surface, said carrier and build surface defining a build region there between;
ii) within said build region, applying by 3D printing a first layer of the composition as defined in claim 1;
iii) irradiating said build region through said optically transparent member to at least partially cure that first layer;
iv) applying a subsequent layer of said composition by 3D printing on the at least partially cured layer; and,
v) irradiating said build region through said optically transparent member to at least partially cure that subsequent layer.

17. An iterative method according to claim 16 for forming a three dimensional object, wherein said steps iv) and v) are performed and repeated so as to dispose second, third, fourth and further layers within the build region.

* * * * *